(12) United States Patent
Lutz et al.

(10) Patent No.: US 7,115,436 B2
(45) Date of Patent: Oct. 3, 2006

(54) INTEGRATED GETTER AREA FOR WAFER LEVEL ENCAPSULATED MICROELECTROMECHANICAL SYSTEMS

(75) Inventors: Markus Lutz, Palo Alto, CA (US); Aaron Partridge, Palo Alto, CA (US)

(73) Assignee: Robert Bosch GmbH, Stuttgart (DE)

(*) Notice: Subject to any disclaimer, the term of this patent is extended or adjusted under 35 U.S.C. 154(b) by 34 days.

(21) Appl. No.: 10/777,326

(22) Filed: Feb. 12, 2004

(65) Prior Publication Data

US 2005/0179099 A1    Aug. 18, 2005

(51) Int. Cl.
*H01L 21/00* (2006.01)
(52) U.S. Cl. .......................................... 438/48
(58) Field of Classification Search ............... 438/48
See application file for complete search history.

(56) References Cited

U.S. PATENT DOCUMENTS

| | | | |
|---|---|---|---|
| 4,849,071 | A | 7/1989 | Evans et al. |
| 4,945,769 | A | 8/1990 | Sidner et al. |
| 5,445,991 | A | 8/1995 | Lee |
| 5,470,797 | A | 11/1995 | Mastrangelo |
| 5,616,514 | A | 4/1997 | Muchow et al. |
| 5,683,591 | A | 11/1997 | Offenberg |
| 5,804,083 | A | 9/1998 | Ishii et al. |
| 5,922,212 | A | 7/1999 | Kano et al. |
| 6,146,917 | A | 11/2000 | Zhang et al. |
| 6,240,782 | B1 | 6/2001 | Kato et al. |
| 6,318,175 | B1 | 11/2001 | Muchow et al. |
| 6,352,935 | B1 | 3/2002 | Collins et al. |
| 6,450,029 | B1 | 9/2002 | Sakai et al. |
| 6,477,901 | B1 | 11/2002 | Tadigadapa et al. |
| 6,507,082 | B1 | 1/2003 | Thomas |
| 6,521,508 | B1 | 2/2003 | Cheong et al. |
| 6,635,509 | B1 | 10/2003 | Ouellet |
| 2002/0016058 | A1 | 2/2002 | Zhao |

FOREIGN PATENT DOCUMENTS

| WO | WO 01/77008 | 10/2001 |
|---|---|---|
| WO | WO 01/77009 | 10/2001 |

OTHER PUBLICATIONS

John L. Vossen, Thin Film Processes Academic Press, vol. I, 1978, pp. 309-311.*

* cited by examiner

Primary Examiner—David S. Blum
(74) Attorney, Agent, or Firm—Neil A. Steinberg

(57) ABSTRACT

There are many inventions described and illustrated herein. In one aspect, present invention is directed to a thin film encapsulated MEMS, and technique of fabricating or manufacturing a thin film encapsulated MEMS including an integrated getter area and/or an increased chamber volume, which causes little to no increase in overall dimension(s) from the perspective of the mechanical structure and chamber. The integrated getter area is disposed within the chamber and is capable of (i) "capturing" impurities, atoms and/or molecules that are out-gassed from surrounding materials and/or (ii) reducing and/or minimizing the adverse impact of such impurities, atoms and/or molecules (for example, reducing the probability of adding mass to a resonator which would thereby change the resonator's frequency). In this way, the thin film wafer level packaged MEMS of the present invention includes a relatively stable, controlled pressure environment within the chamber to provide, for example, a more stable predetermined, desired and/or selected mechanical damping of the mechanical structure.

28 Claims, 31 Drawing Sheets

INTEGRATED GETTER AREA FOR WAFER LEVEL ENCAPSULATED MICROELECTROMECHANICAL SYSTEMS

This invention relates to microelectromechanical systems and/or nanoelectromechanical systems (collectively hereinafter "microelectromechanical systems") and techniques for fabricating microelectromechanical systems; and more particularly, in one aspect, for fabricating or manufacturing microelectromechanical systems having mechanical structures that are encapsulated using thin film or wafer level encapsulation techniques in a chamber, and including an integrated getter area and/or an enhanced volume of the chamber.

Microelectromechanical systems ("MEMS"), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques. For example, with reference to FIG. 1A, a MEMS resonator typically includes mechanical structure 12, including movable electrode 14, fixed electrodes 16a, 16b and 18, anchors 20a and 20b, and periphery area 22 that surrounds and/or borders mechanical structure 12.

Notably, in conventional MEMS, the fixed electrodes and the periphery area tend to be solid or contiguous structures (see, for example, fixed electrode 16a and periphery area 22 in FIGS. 1A and 1B). In this regard, the mechanical structure is typically fabricated from or on, for example, a silicon substrate. The silicon substrate is disposed on an insulation layer that, among other things, serves as a sacrificial layer for the MEMS. During fabrication, the movable and fixed electrode electrodes, anchors 20a and 20b, and periphery area 22 are formed and significant portions of the insulation layer are etched or removed in order to release the moveable electrodes of the mechanical structure. (See, for example, U.S. Pat. Nos. 6,450,029 and 6,240,782). In this way, the mechanical structure may function, for example, as a resonator, accelerometer, gyroscope or other transducer (for example, pressure sensor, strain sensor, tactile sensor, magnetic sensor and/or temperature sensor). Notably, the fixed electrodes and the periphery area are solid and/or contiguous structures that are largely unaffected during the release of the moveable electrodes.

After fabrication of the mechanical structures, those structures are typically sealed in a chamber. Conventional MEMS seal these structures in, for example, a hermetically sealed metal or ceramic package. Conventional MEMS also employ bonding encapsulation techniques whereby a semiconductor or glass-like substrate having a chamber to house, accommodate or cover the mechanical structure is bonded (for example, via anodic, frit glass or fusion bonding) to the substrate in which the mechanical structures are formed (see, for example, U.S. Pat. Nos. 6,146,917; 6,352,935; 6,477, 901; and 6,507,082).

Such conventional MEMS typically provide a relatively large volume and often include a getter material to "capture" impurities, atoms and/or molecules that are out-gassed from, for example, the silicon substrate, during operation. As such, conventional MEMS exhibit a relatively stable pressure within the chamber over a significant period of time and operating conditions (for example, operating over a large range of operating temperatures which tend to induce release of impurities, atoms and/or molecules).

Another encapsulation technique employs a thin film approach using micromachining during, for example, wafer level packaging of the mechanical structures. (See, for example, International Published Patent Applications Nos. WO 01/77008 A1 and WO 01/77009 A1). Conventional MEMS having mechanical structures that are packaged at the wafer stage tend to have a smaller volume relative to hermetically ceramic packages and bonding encapsulation techniques. In addition, due to subsequent processing (often at high temperatures), thin film wafer level packaged MEMS are not able to effectively employ a getter material to "capture" impurities, atoms and/or molecules that are out-gassed from surrounding materials. As such, conventional thin film wafer level packaged MEMS are more susceptible to pressure instability within the chamber. This instability may increase over time and operating conditions (for example, operating over a large range of operating temperatures).

Thus, there is a need for, among other things, a MEMS employing thin film wafer level packaging techniques that overcomes one, some or all of the shortcomings pertaining to gettering and volume constraints of the conventional thin film wafer level packaging techniques. There is a need for, among other things, a MEMS, including mechanical structures that are encapsulated using thin film encapsulation, that includes enhanced getter capabilities and/or an enhanced volume of the chamber containing the mechanical structures with little to no increase in overall dimensions of the MEMS. In this way, the thin film wafer level packaged MEMS of the present invention includes a relatively stable, controlled pressure environment within the chamber to provide, for example, a more stable predetermined, desired and/or selected mechanical damping of the mechanical structure(s).

SUMMARY OF THE INVENTION

There are many inventions described and illustrated herein. In a first principal aspect, the present invention is a method of manufacturing a microelectromechanical device having a mechanical structure and a periphery area that are disposed over a substrate and in a chamber which is formed, at least in part, by a thin film encapsulation structure. The method includes forming the mechanical structure, forming the periphery area wherein the periphery area includes a plurality of gaps therein, and sealing the chamber by depositing the thin film encapsulation structure.

In one embodiment, sealing the chamber by depositing the thin film encapsulation structure may include depositing a sacrificial layer around at least a portion of the mechanical structure and the periphery area and depositing a first encapsulation layer over the sacrificial layer. Thereafter, at least one vent may be formed through the first encapsulation layer (for example, polycrystalline silicon, amorphous silicon, germanium, silicon/germanium and/or gallium arsenide) to allow removal of at least a portion of the sacrificial layer. After removing at least a portion of the sacrificial layer from the mechanical structure and the periphery area, a second encapsulation layer (for example, is a semiconductor material which comprises of polycrystalline silicon, amorphous silicon, silicon carbide, silicon/germanium, germanium and/or gallium arsenide) may be deposited over or in the vent to seal the chamber.

Notably, the method may further include removing at least a portion of a sacrificial layer of the substrate that is disposed beneath the mechanical structure and the gaps of the periphery area.

The method of this aspect of the present invention may further include forming the fixed electrodes and/or anchor regions wherein the fixed electrodes and/or anchor regions may include a plurality of gaps therein.

In yet another embodiment, the method of the present invention may further include forming the fixed electrodes wherein the fixed electrodes include a plurality of gaps therein and forming the anchor regions wherein the anchor regions include a plurality of gaps therein. In addition, sealing the chamber by depositing the thin film encapsulation structure may further include depositing a sacrificial layer around at least a portion of the mechanical structure, including the fixed electrodes and the anchor region, and the periphery area, including the gaps therein, depositing a first encapsulation layer over the sacrificial layer, forming at least one vent through the first encapsulation layer to allow removal of at least a portion of the sacrificial layer, thereafter removing at least a portion of the sacrificial layer from the mechanical structure, including from the gaps in the fixed electrodes, the anchor region, and the periphery area. After such removal, the method further includes depositing a second encapsulation layer over or in the vent to seal the chamber.

In another aspect, the present invention is a microelectromechanical device comprising a substrate, a mechanical structure disposed over the substrate, a periphery area disposed over the substrate, wherein the periphery area includes a plurality of gaps therein, and a thin film encapsulation structure, disposed over the mechanical structure and the periphery area, to partially define and seal a chamber.

In certain embodiments, the thin film encapsulation structure of the microelectromechanical device may include first and second encapsulation layers. In this regard, the first encapsulation layer may be comprised of polycrystalline silicon, porous polycrystalline silicon, amorphous silicon, silicon carbide, silicon nitride, silicon/germanium, germanium, or gallium arsenide. Further, the second encapsulation layer may be comprised of polycrystalline silicon, porous polycrystalline silicon, amorphous silicon, germanium, silicon/germanium, gallium arsenide, or silicon carbide.

The mechanical structure may also include a plurality of fixed electrodes, wherein the fixed electrodes include a plurality of gaps therein. Indeed, the mechanical structure may include a plurality of anchor regions, wherein the anchor regions include a plurality of gaps therein.

The mechanical structure may be a resonator including at least one fixed electrode, and anchor region, and at least one moveable electrode that is physically connected to an anchor region and adjacent to the fixed electrode, and wherein the fixed electrode and the anchor region include a plurality of gaps.

In yet another aspect, the present invention is a microelectromechanical device comprising a substrate, a mechanical structure disposed over the substrate wherein the mechanical structure includes moveable and fixed electrodes, a periphery area disposed over the substrate, a getter area, disposed in predetermined portions of the periphery area and the fixed electrodes, and a chamber, wherein the mechanical structure, periphery area and the getter area are at least partially disposed in the chamber and wherein the getter area is exposed to fluid in the chamber. The microelectromechanical device of this aspect of the invention also includes a thin film encapsulation structure, disposed over the mechanical structure, the periphery area and the getter area, wherein the encapsulation seals the chamber.

In one embodiment, the getter area includes gaps in portions of the periphery area and the fixed electrodes. The getter area, in one embodiment, is capable of capturing impurities, atoms or molecules that are out-gassed from materials contained within the chamber.

The mechanical structure may be a resonator. In this embodiment, the thin film encapsulation structure includes first and second encapsulation layers. The first encapsulation layer may be comprised of polycrystalline silicon, porous polycrystalline silicon, amorphous silicon, silicon carbide, silicon nitride, silicon/germanium, germanium, or gallium arsenide. The second encapsulation layer may be comprised of polycrystalline silicon, porous polycrystalline silicon, amorphous silicon, germanium, silicon/germanium, gallium arsenide, or silicon carbide.

Again, there are many inventions described and illustrated herein. This Summary of the Invention is not exhaustive of the scope of the present invention. Moreover, this Summary is not intended to be limiting of the invention and should not be interpreted in that manner. While certain embodiments, features, attributes and advantages of the inventions have been described in this Summary, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION

There are many inventions described and illustrated herein. In one aspect, the present invention is directed to a thin film encapsulated MEMS, and technique of fabricating or manufacturing a thin film encapsulated MEMS, having an integrated getter area and/or an enhanced chamber volume which, from the perspective of the mechanical structure and chamber, causes little to no increase in overall dimension(s) of the MEMS. The integrated getter area is disposed within the chamber and is capable of (i) "capturing" impurities, atoms and/or molecules that are out-gassed from surrounding materials and/or (ii) reducing and/or minimizing the adverse impact of such impurities, atoms and/or molecules (for example, reducing the probability of adding mass to a resonator which would thereby change the resonator's frequency). In this way, the thin film wafer level packaged MEMS of the present invention includes a relatively stable, controlled pressure environment within the chamber to provide, for example, a more stable predetermined, desired and/or selected mechanical damping of the mechanical structure.

The present invention encapsulates the mechanical structures within the chamber, prior to final packaging and/or completion of the MEMS, using a thin film structure. The environment within the chamber containing and/or housing the mechanical structures provides a relatively stable, controlled, predetermined, desired and/or selected mechanical damping. In this regard, the parameters (for example, pressure) of the fluid (for example, a gas or a gas vapor) within the chamber and in which the mechanical structures are to operate are relatively stable, controlled, selected and/or designed to provide a desired and/or predetermined operating environment.

Figure 1A:
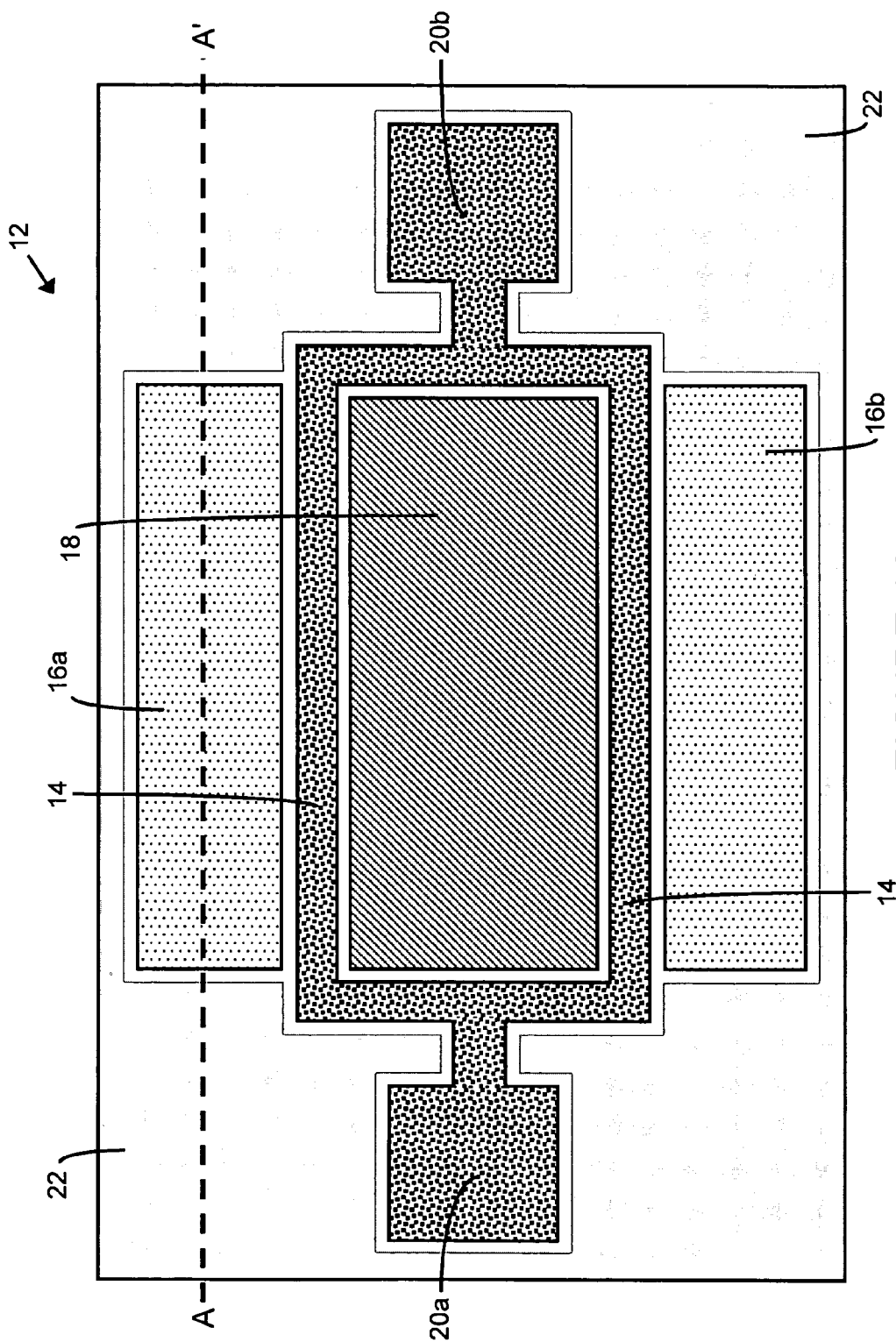
FIG. 1A illustrates a top view of the mechanical structure of a conventional MEMS resonator, including moveable electrode, fixed electrodes, anchors and a periphery area.
Figure 1B:
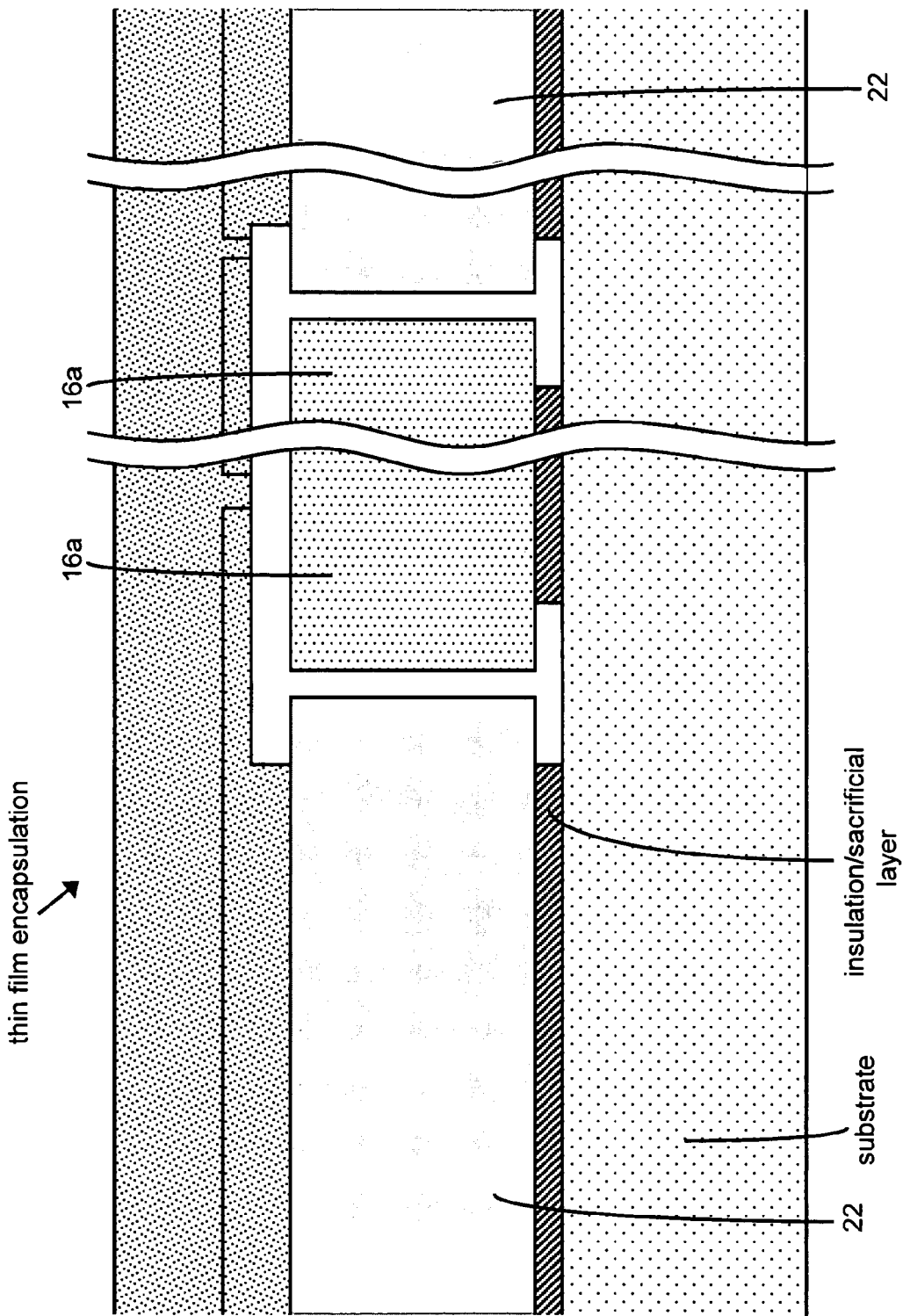
FIG. 1B is a cross-sectional view (sectioned along dotted line A–A' of FIG. 1) of a portion of the periphery area and the fixed electrode of the MEMS resonator of FIG. 1.
Figure 2:
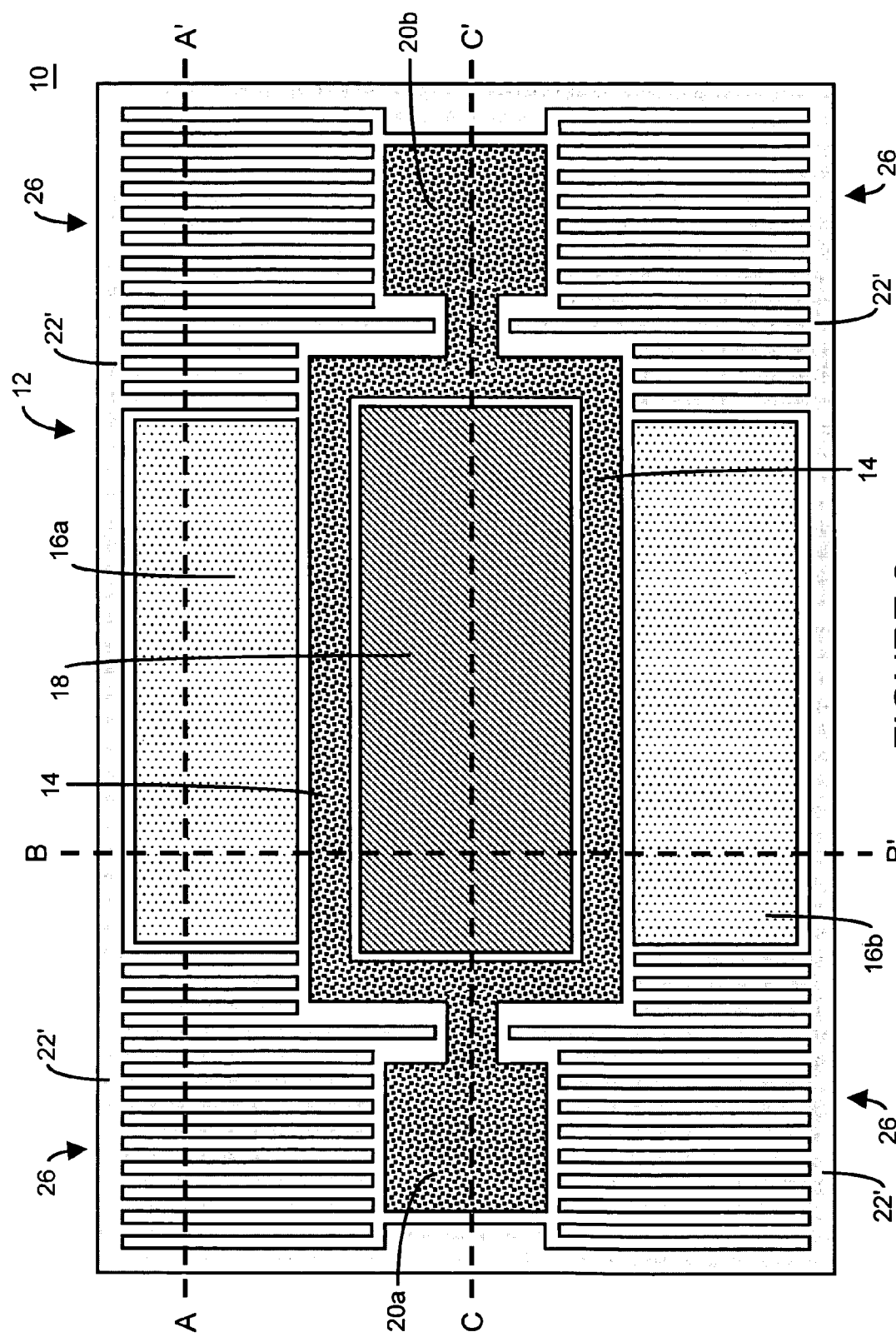
FIG. 2 illustrates a top view of a mechanical structure of a MEMS resonator according to one embodiment of the present invention whereby the periphery area is processed, configured and/or treated to provide an increased surface area and the chamber having an increased volume.
Figure 3A:
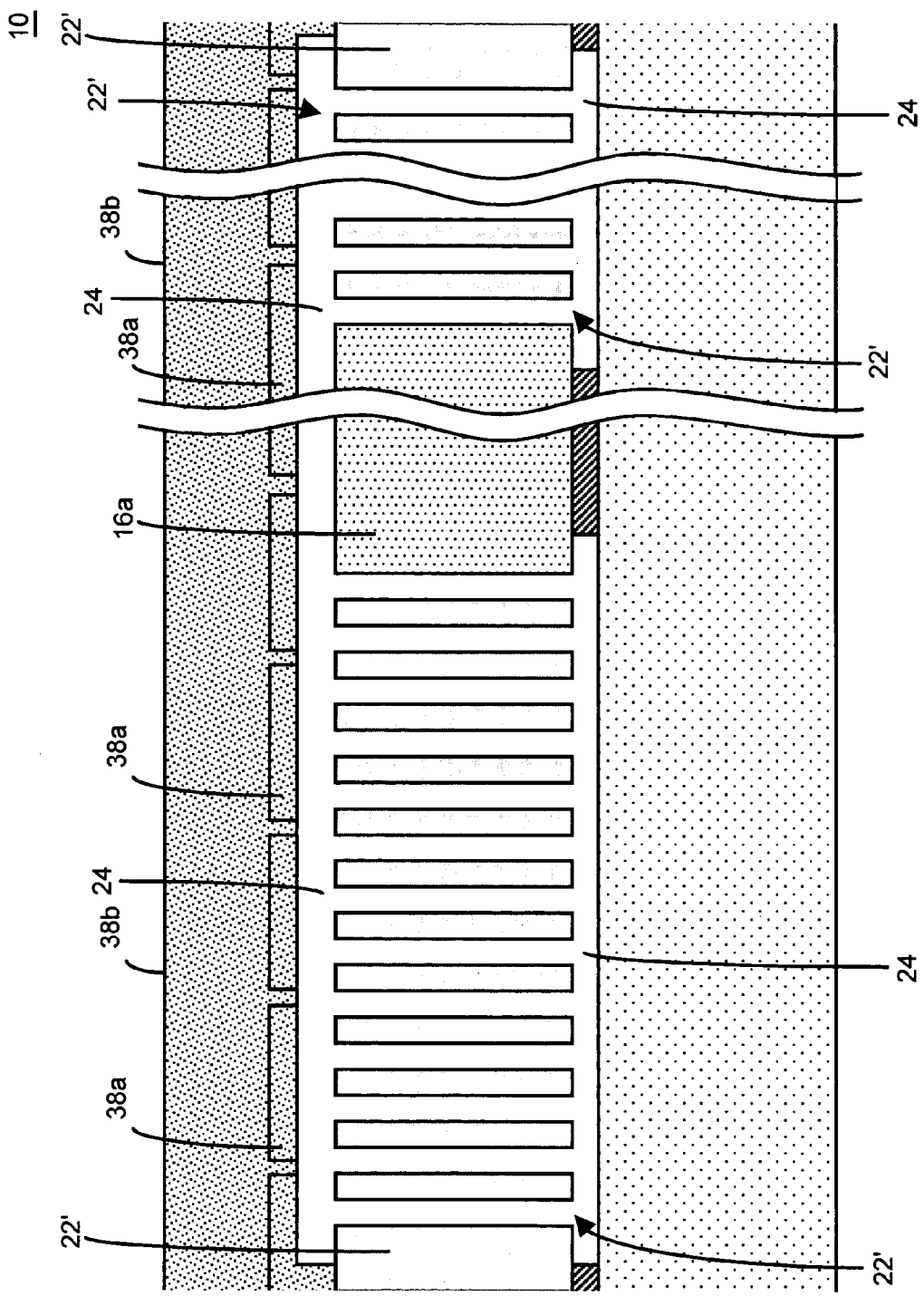
FIG. 3A is a cross-sectional view (sectioned along dotted line A–A' of FIG. 2) of a portion of the periphery area and the fixed electrode of the MEMS resonator of FIG. 2, in accordance with certain aspects of the present invention.
Figure 3B:
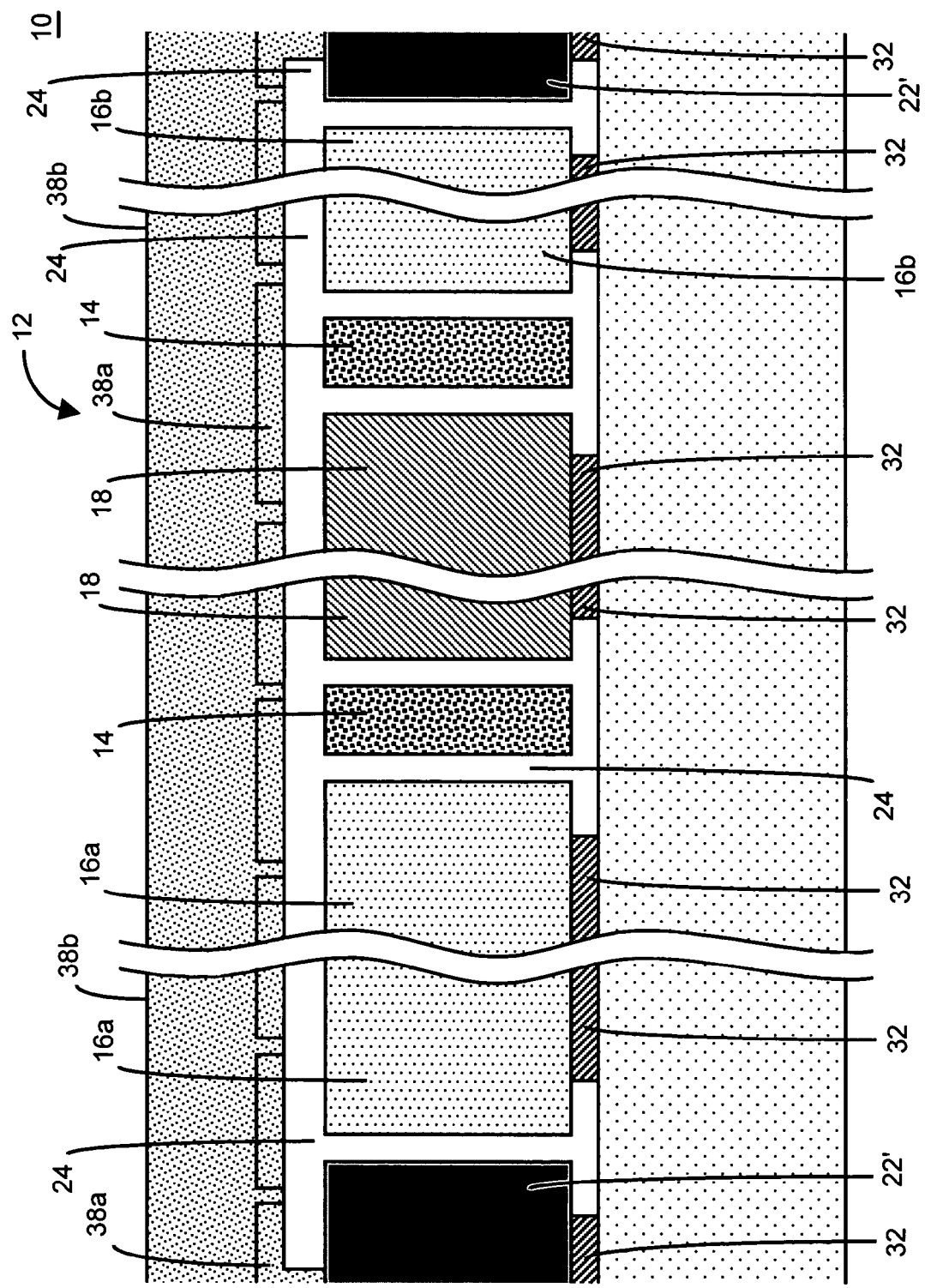
FIG. 3B is a cross-sectional view (sectioned along dotted line B–B' of FIG. 2) of a portion of the periphery area, the fixed electrodes and the moveable electrodes of the MEMS resonator of FIG. 2, in accordance with certain aspects of the present invention.

With reference to FIGS. 2, 3A and 3B, in a first embodiment, thin film wafer level packaged MEMS device 10 includes an enhanced volume and/or integrated getter area. In this regard, selected and/or predetermined portions of periphery area 22' are etched, patterned and/or removed to form gaps, trenches and/or slices in periphery area 22'. The gaps, trenches and/or slices in periphery area 22' increases the volume of chamber 24. Moreover, the increase in surface area and/or surfaces within chamber 24 enhances the getter characteristics of MEMS 10. In this regard, getter area 26 is integrated into chamber 24 of MEMS 10 and, in this embodiment, is located next to, adjacent and/or near mechanical structure 12. As such, when chamber 24 (which contains and/or houses mechanical structure 12) is "sealed", the overall volume of chamber 24 is greater (for example, a relative increase of between 10× to 1000×) and the getter characteristics are enhanced (for example, the patterned periphery area may (1) facilitate diffusion of volatile species in the surrounding solids during subsequent high temperature process steps—which may result in a "cleaner" and/or more pure fluid within chamber 24, and/or (2) reduce the probability of mass loading on the moveable electrode 14 as a result of the increase in the surface areas within chamber 24). Indeed, by enhancing the getter characteristics of MEMS 10, temperature variations are less likely to cause mass loading (and evaporation of mass) thereby reducing the probability of hysteresis (for example a hysteretic change in the frequency response of a resonator due to temperature). Such hysteresis may limit the performance of a resonator absent compensation.

With reference to FIGS. 4A–4F, an exemplary method of fabricating or manufacturing MEMS 10 according to the present invention may begin with forming and/or patterning movable electrode 14 (not illustrated in the cross-sections of FIGS. 4A–4F), fixed electrodes 16a, 16b and 18, anchors 20a and 20b (not illustrated in the cross-sections of FIGS. 4A–4F), and periphery area 22' using well-known lithographic and etching techniques in or on SOI substrate 28.

Figure 4A:
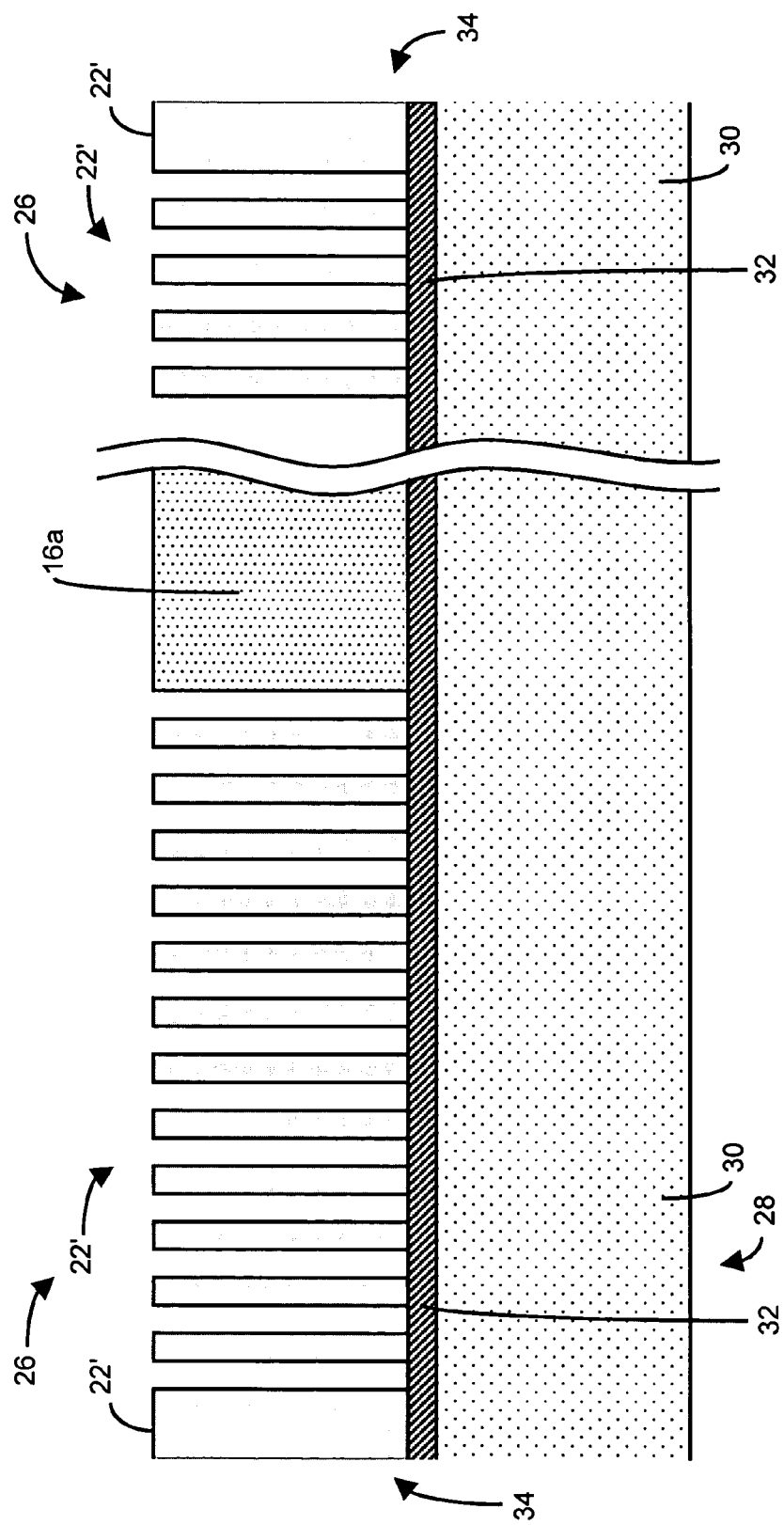
FIGS. 4A–4F illustrate cross-sectional views (sectioned along dotted line A–A' of FIG. 2) of the fabrication of the MEMS of FIG. 2 at various stages of a process that employs an exemplary thin film encapsulation technique, according to certain aspects of the present invention.

In particular, with reference to FIG. 4A, MEMS 10 is formed in or on SOI substrate 28. The SOI substrate 28 includes first substrate layer 30 (for example, a semiconductor (such as silicon), glass or sapphire), first sacrificial/insulation layer 32 and first semiconductor layer 34. In one embodiment, SOI substrate 28 may be a SIMOX wafer which is fabricated using well-known techniques. In another embodiment, SOI substrate 28 may be a conventional SOI wafer having a first semiconductor layer 34. In this regard, SOI substrate 36 having a relatively thin first semiconductor layer 28 may be fabricated using a bulk silicon wafer which is implanted and oxidized by oxygen to thereby form a relatively thin $SiO_2$ underneath the single or mono crystalline wafer surface. In this embodiment, first semiconductor layer 28 (i.e., monocrystalline silicon) is disposed on first sacrificial/insulation layer 32 (i.e. silicon dioxide) which is disposed on a first substrate layer 30 (i.e., monocrystalline silicon).

Notably, all techniques for providing or fabricating SOI substrate 28, whether now known or later developed, are intended to be within the scope of the present invention, for example, well-known formation, lithographic, etching and/or deposition techniques using a standard or over-sized ("thick") wafer (not illustrated) and/or bonding techniques (i.e, bonding two standard wafers together where the lower/bottom wafer includes a sacrificial layer (for example, silicon oxide) disposed thereon and the upper/top wafer is thereafter thinned (ground down or back) and polished to receive the mechanical structures in or on).

In this embodiment, mechanical structure 12 is disposed on first sacrificial/insulation layer 32, for example, silicon dioxide or silicon nitride (see, for example, FIG. 3B). As mentioned above, mechanical structure 12 may be formed using well-known lithographic, etching and/or doping techniques as well as from well-known materials (for example, semiconductors such as silicon, germanium, silicon-germanium or gallium-arsenide). In particular, selective portions of periphery area 22' are etched, patterned and/or removed to form gaps, trenches and/or slices in periphery area 22'. As described in detail below, these gaps, trenches and/or slices provide additional volume to chamber 24 after encapsulation as well as increasing the surface area in chamber 24 which may enhance the getter characteristics of MEMS 10. The additional surface area in chamber 24 may absorb any reactants diffusing into cavity 24 and/or out-gassing from surrounding materials in or near chamber 24 (for example, from first sacrificial/insulation layer 32).

Notably, while the gaps, trenches and/or slices in periphery area 22' are illustrated as a repeating pattern, extending to the surface of first sacrificial/insulation layer 32, any pattern, shape and/or depth of the gaps, trenches and/or slices in periphery area 22' may be employed (See, for example, FIG. 15A–15E). However, it may be advantageous to form the gaps, trenches and/or slices in periphery area 22' during the same lithographic and etching process that forms other portions of mechanical structure 12 (for example, moveable electrode 14). In this way, the number of process steps may be reduced and/or maintained constant.

After formation of periphery area 22', MEMS 10 may be encapsulated to form cavity 24 and define the atmosphere contained therein. In this regard, MEMS 10 may be sealed or encapsulated using conventional thin film encapsulation techniques and structures. (See, for example, WO 01/77008 A1 and WO 01/77009 A1). Other thin film encapsulation techniques are suitable. Indeed, all thin film encapsulation techniques, whether now known or later developed, are intended to be within the scope of the present invention.

For example, the encapsulation techniques described and illustrated in non-provisional patent application "Microelectromechanical Systems Having Trench Isolated Contacts, and Methods of Fabricating Same", which was filed on Jun. 4, 2003 and assigned Ser. No. 10/455,555 (hereinafter "Microelectromechanical Systems Having Trench Isolated Contacts Patent Application") may be employed. All of the inventions/embodiments (including, for example, the encapsulation and electrical isolation techniques) described and illustrated in the Microelectromechanical Systems Having Trench Isolated Contacts Patent Application may be implemented in conjunction with the inventions described and illustrated herein. For the sake of brevity, the inventions/embodiments described and illustrated in the Microelectromechanical Systems Having Trench Isolated Contacts Patent Application, implemented in conjunction with the inventions described and illustrated herein, will not be repeated in detail but will only be summarized. It is expressly noted, however, that the entire contents of the Microelectromechanical Systems Having Trench Isolated Contacts Patent Application, including, for example, the features, attributes, alternatives, materials, techniques and advantages of all of the inventions, are incorporated by reference herein.

Figure 4B:
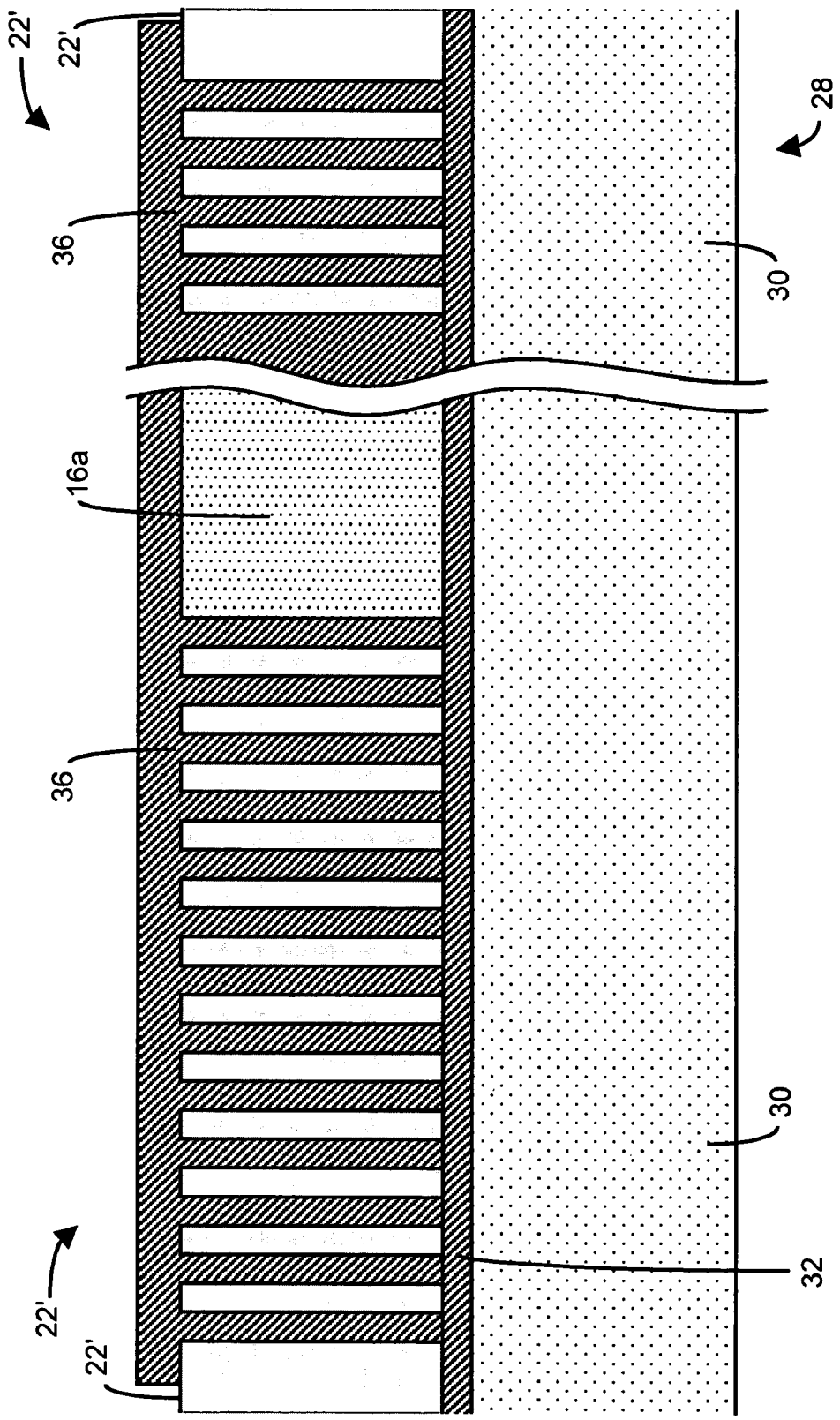

With reference to FIG. 4B, following formation of trenches, gaps and/or slices in periphery area 22' (as well as other aspects of mechanical structure 12, for example, fixed and moveable electrodes 14, 16a, 16b, and 18 (not illustrated in FIG. 4B)), second sacrificial layer 36, for example, silicon dioxide or silicon nitride, may be deposited and/or formed to secure, space and/or protect mechanical structure 12, including moveable electrode 14 (not illustrated), fixed electrodes 16a, 16b (not illustrated) and 18 (not illustrated), and periphery area 22' during subsequent processing, including the exemplary encapsulation process.

Figure 4C:
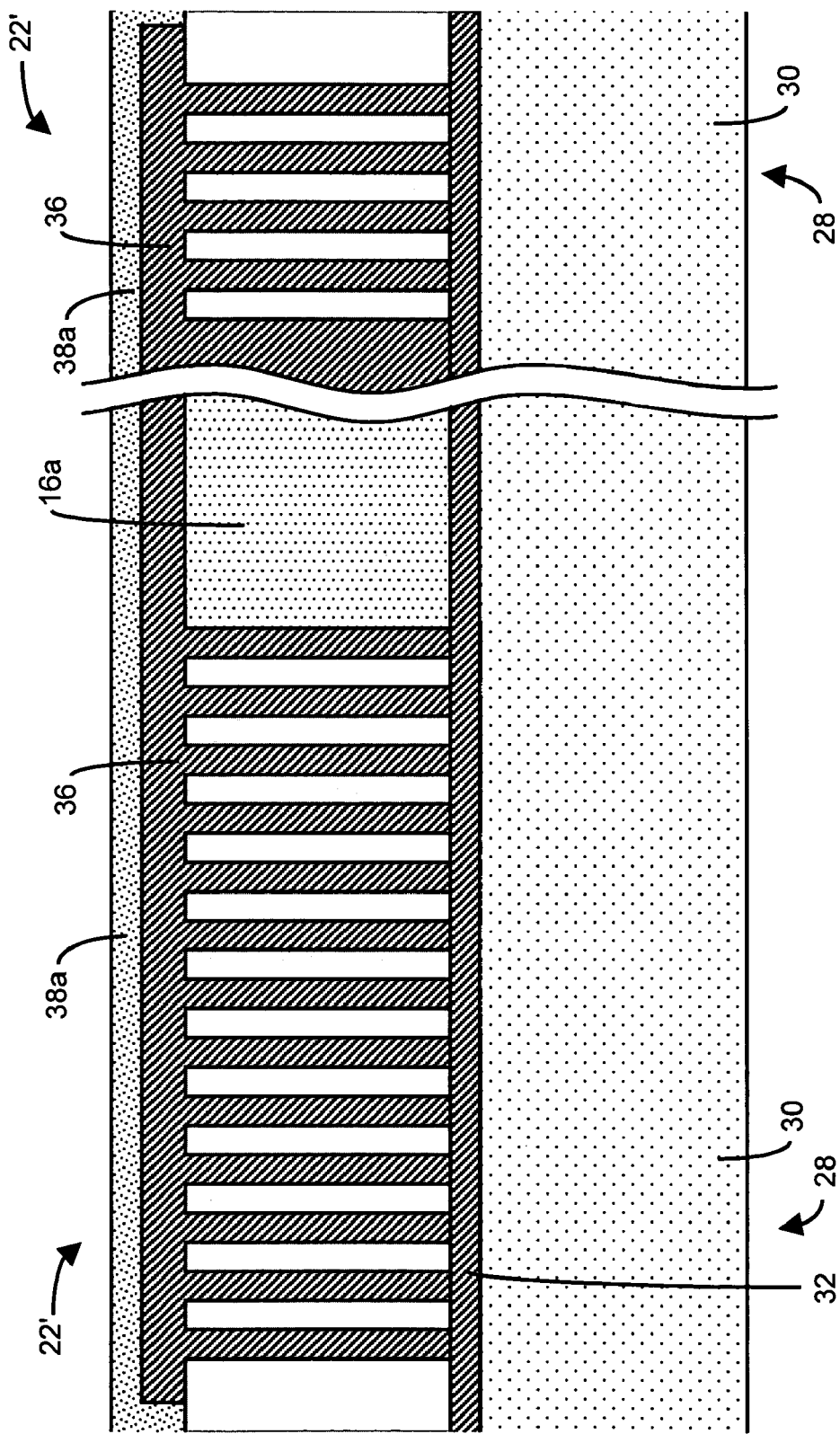
Figure 4D:
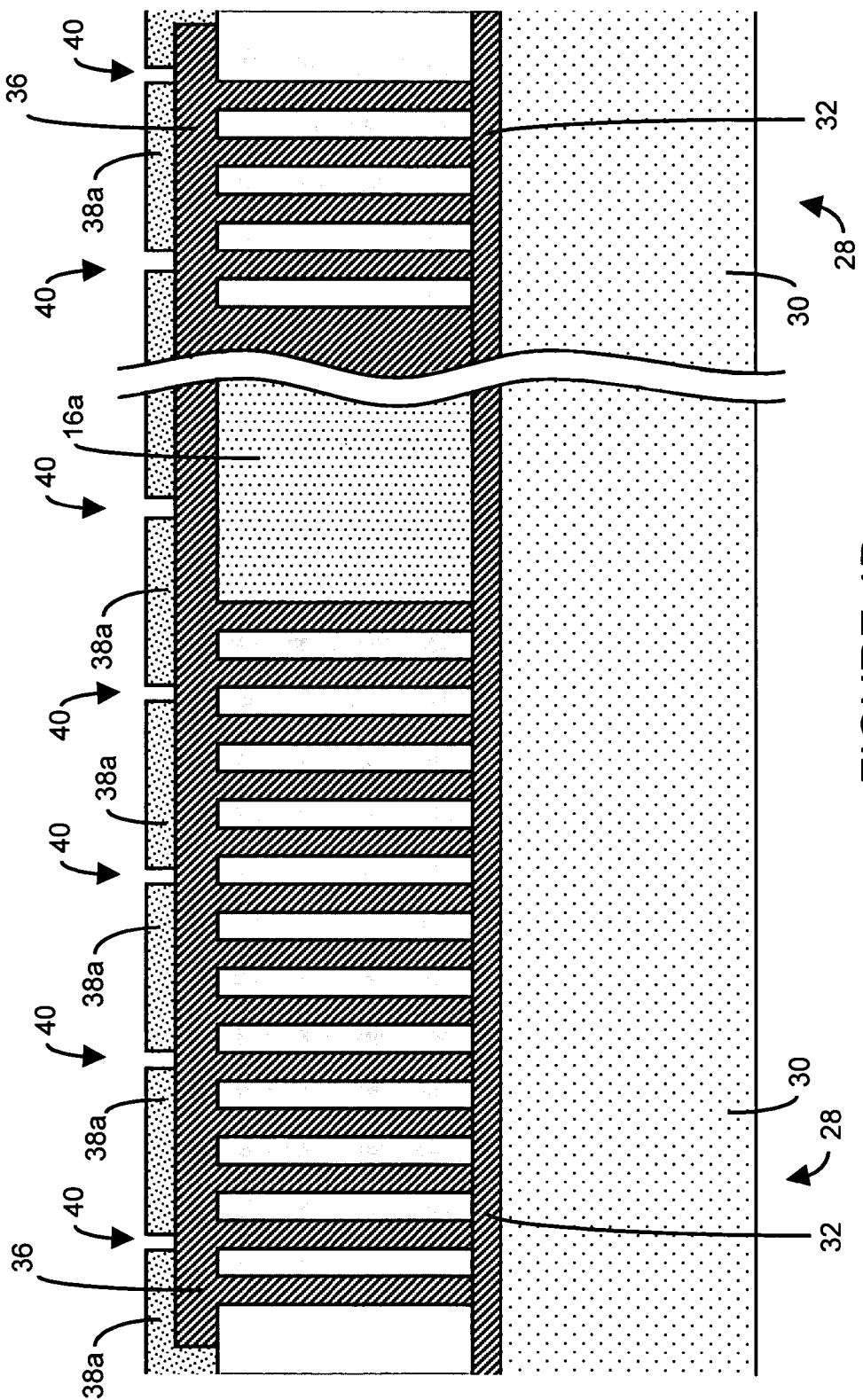
Figure 4E:
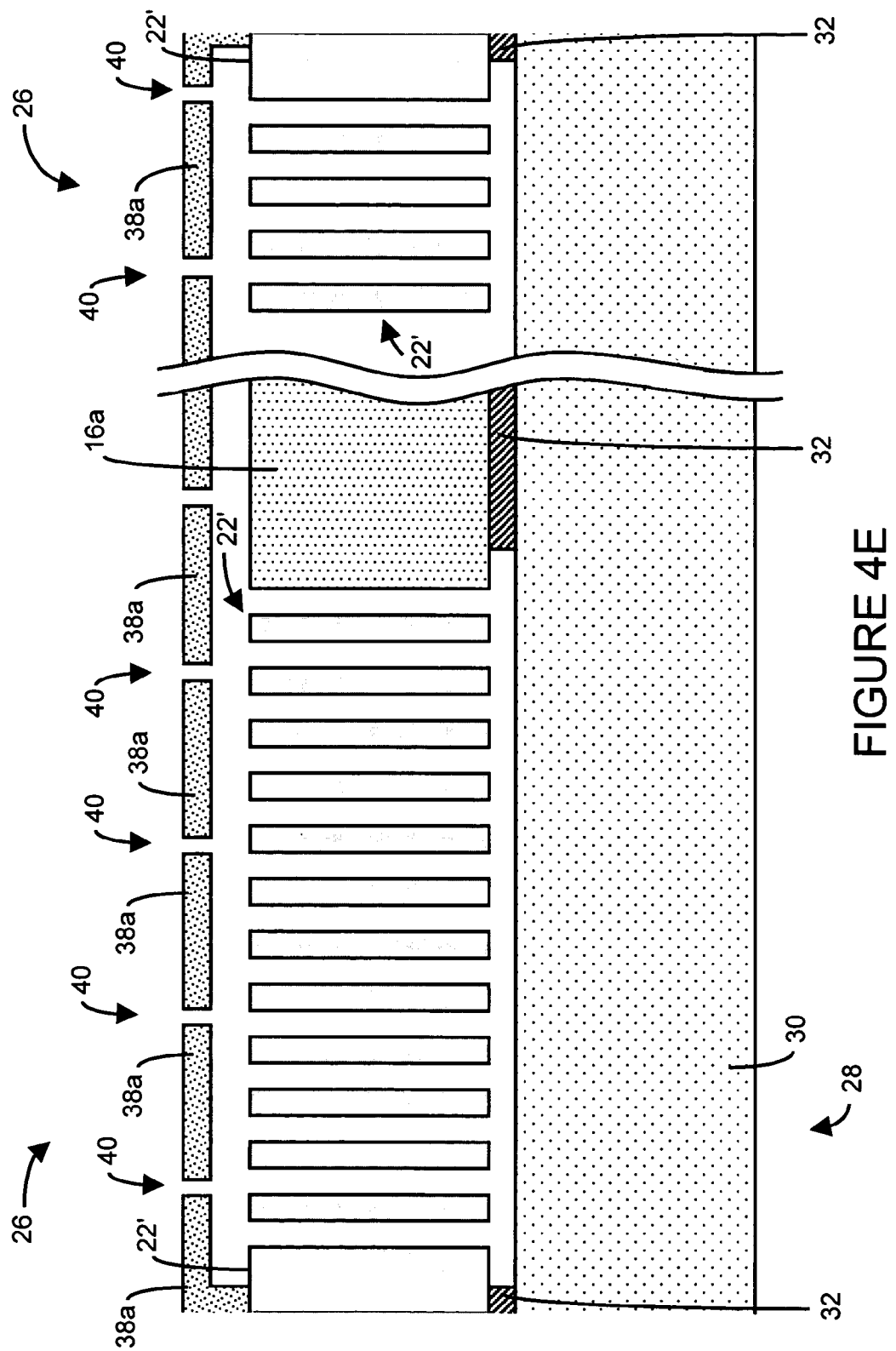

With reference to FIGS. 4C, 4D and 4E, thereafter, first encapsulation layer 38a may be deposited, formed and/or grown on second sacrificial layer 36 (see, FIG. 4C). The deposition, formation and/or growth may be by a conformal process or non-conformal process using, for example, a chemically vapor deposited ("CVD") or epitaxial process. In one embodiment, the thickness of first encapsulation layer 38a in the region overlying second sacrificial layer 36 may be between 0.1 µm and 5.0 µm. The external environmental stress on, and internal stress of first encapsulation layer 38a after etching second sacrificial layer 36 may impact the thickness of first encapsulation layer 38a. Slightly tensile films may self-support better than compressive films which may buckle.

The first encapsulation layer 38a may then be etched to form passages or vents 40 (see, FIG. 4D). In one exemplary embodiment, vents 40 have a diameter or aperture size of between 0.1 µm to 2 µm. The vents 40 permit etching and/or removal of at least selected portions of first and second sacrificial layers 32 and 36, respectively (see, FIG. 4E).

Notably, certain portions of mechanical structure 12 may remain partially, substantially or entirely surrounded by portions of first and second sacrificial layers 32 and 36. For example, with reference to FIGS. 3A, 3B and 4E, while moveable electrodes 14 are released from their respective underlying columns of first sacrificial/insulation layer 32 (see, for example FIG. 3B), a portion of first sacrificial/insulation layer 32 will remain beneath fixed electrode 16a after etching or removing second sacrificial layer 36 (see, for example, FIGS. 3A and 4E. Moreover, first and second sacrificial layers 32 and 36 that surround periphery area 22' may be entirely or partially removed. It may be advantageous to remove all of first and second sacrificial layers 32 and 36 from the gaps, slices and/or trenches of periphery area 22' in order to increase the getter characteristics as well as the volume of chamber 24.

Accordingly, with reference to FIG. 4E, using well-known etching techniques and materials, first sacrificial/insulation layer 32 and second sacrificial layer 36 may be etched or removed to expose the gaps, slices and/or trenches of periphery area 22'. For example, in one embodiment, where layers 32 and 36 are comprised of silicon dioxide, selected portions may be removed/etched using well-known wet etching techniques and buffered HF mixtures (i.e., a buffered oxide etch) or well-known vapor etching techniques using vapor HF (water or alcohol based vapor or using anhydrous HF gas). In another embodiment, where layers 32 and 36 are comprised of silicon nitride, selected portions may be removed/etched using phosphoric acid.

It should be noted that there are: (1) many suitable materials for layers 36 and/or 36 (for example, silicon dioxide, silicon nitride, and doped and undoped glass-like materials, e.g., phosphosilicate ("PSG") or borophosphosilicate ("BPSG")) and spin on glass ("SOG")), (2) many suitable/associated etchants (for example, a buffered oxide etch, phosphoric acid, and alkali hydroxides such as, for example, NaOH and KOH), and (3) many suitable etching or removal techniques (for example, wet, plasma, vapor or dry etching), to eliminate, remove and/or etch layers 32 and/or 36. Accordingly, all materials, etchants and etch techniques, and permutations thereof, for eliminating, removing and/or etching, whether now known or later developed, are intended to be within the scope of the present invention.

Figure 4F:
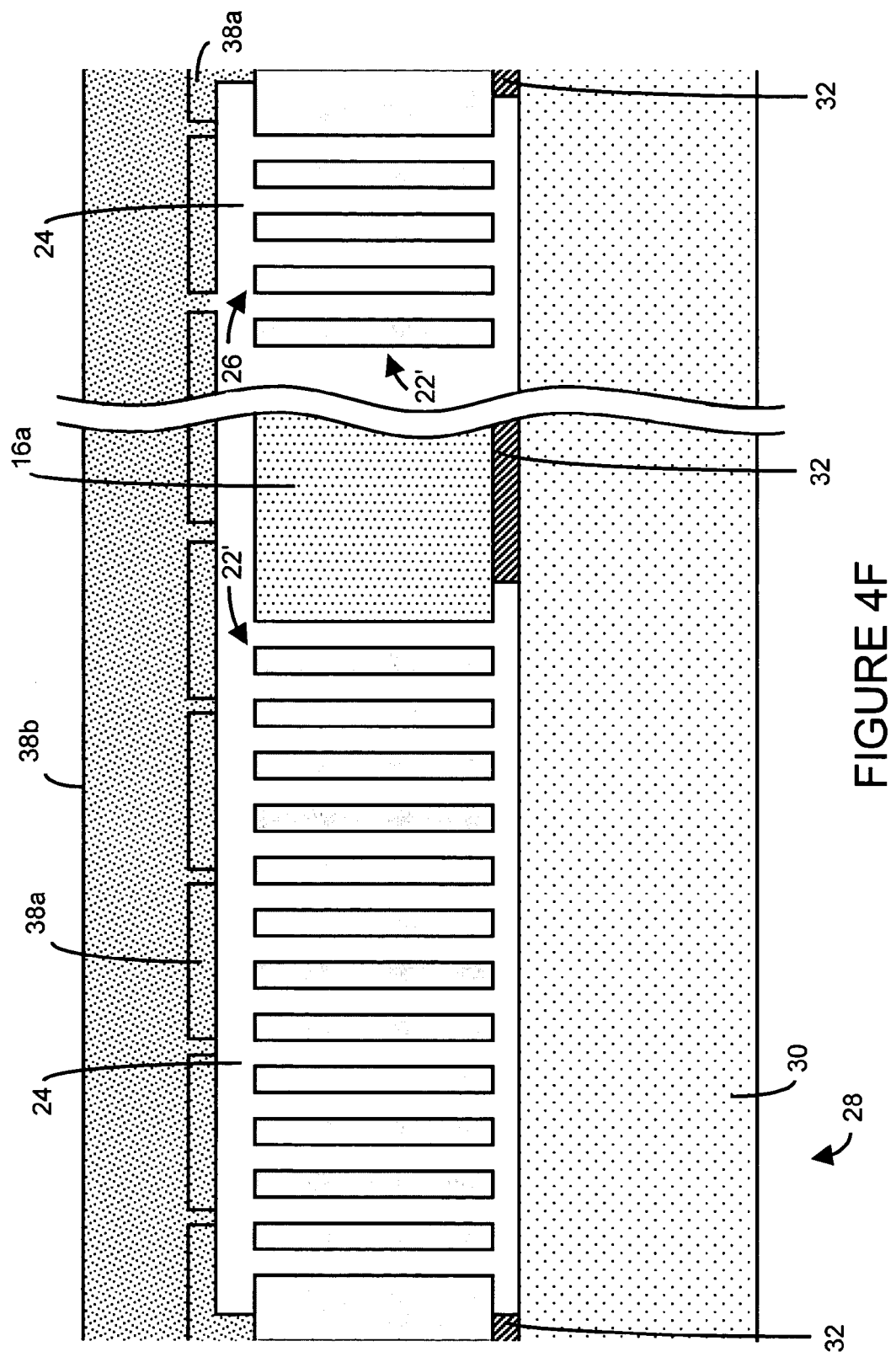
Figure 5:
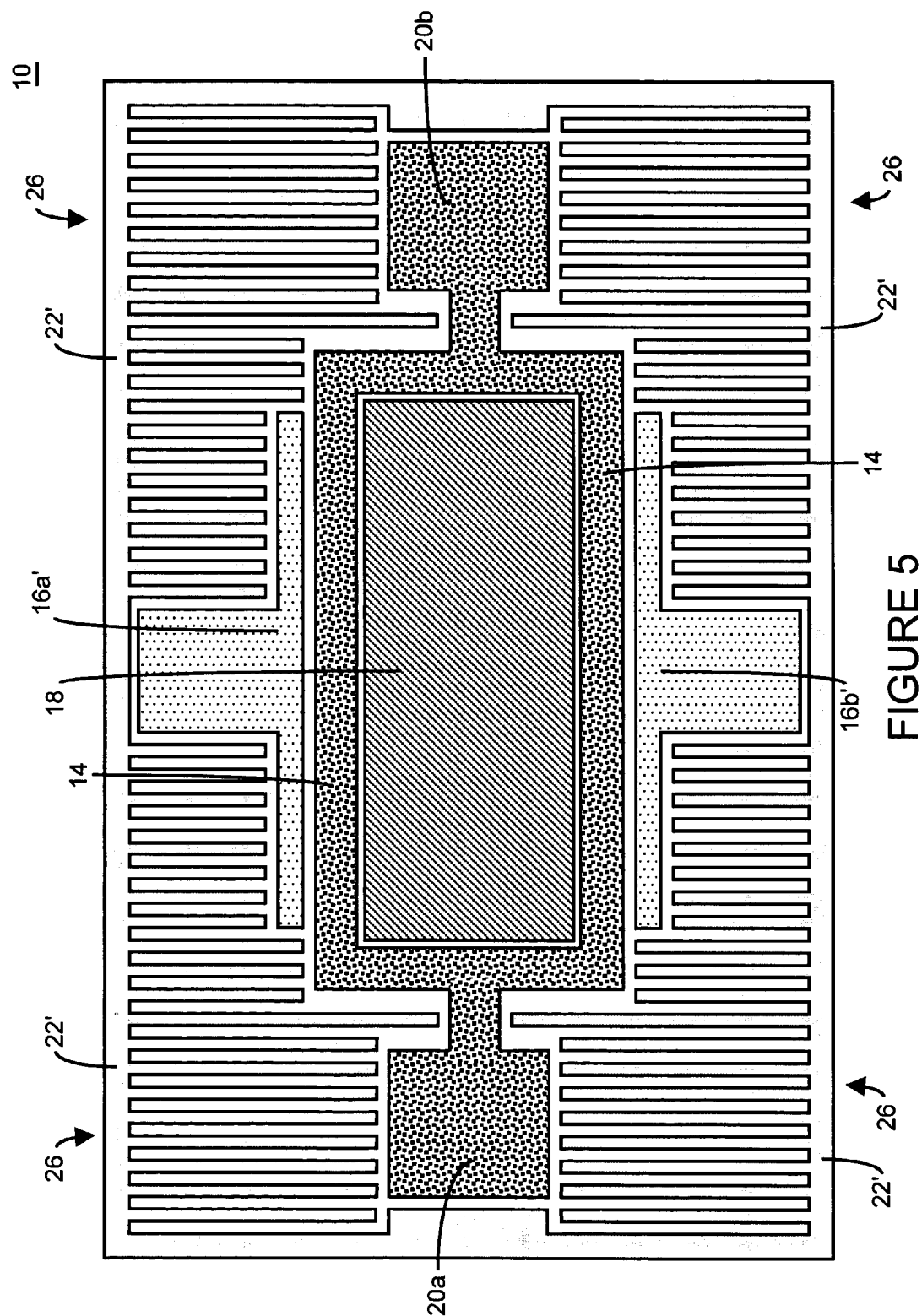
FIGS. 5–10 illustrate top views of a mechanical structure of a MEMS resonator according to exemplary and various embodiments of the present invention whereby the periphery area and/or one or more fixed electrodes are processed, configured and/or treated to provide an increased surface area and the chamber having an increased volume.

With reference to FIG. 4F, after removing (all or at lest some of) layers 32 and/or 36 surrounding the gaps, slices and/or trenches of periphery area 22', second encapsulation layer 38b may be deposited, formed and/or grown. The second encapsulation layer 38b may be, for example, a silicon-based material (for example, a polycrystalline silicon or silicon-germanium), which is deposited using, for example, an epitaxial, a sputtering or a CVD-based reactor (for example, APCVD, LPCVD, or PECVD). The deposition, formation and/or growth may be by a conformal process or non-conformal process. The material may be the same as or different from first encapsulation layer 38a.

The state of the fluid within chamber 24 (for example, the pressure), after "sealing" chamber 24 and/or after deposition or formation of second encapsulation layer 38b may be determined using conventional techniques and/or using those techniques described and illustrated in non-provisional patent application entitled "Electromechanical System having a Controlled Atmosphere, and Method of Fabricating Same", which was filed on Mar. 20, 2003 and assigned Ser. No. 10/392,528 (hereinafter "the Electromechanical System having a Controlled Atmosphere Patent Application"). For the sake of brevity, all of the inventions regarding controlling the atmosphere within chamber 24 which are described and illustrated in the Electromechanical System having a Controlled Atmosphere Patent Application will not be repeated here. However, the inventions/embodiments (including, for example, controlling the pressure of the fluid in the chamber during encapsulation) described and illustrated in the Electromechanical System having a Controlled Atmosphere Patent Application may be implemented in conjunction with the inventions described and illustrated herein. It is expressly noted, however, that the entire contents of the Electromechanical System having a Controlled Atmosphere Patent Application, including, for example, the features, attributes, alternatives, materials, techniques and advantages of all of the inventions, are incorporated by reference herein.

With reference to FIGS. 5–10, in other embodiments, portions of fixed electrodes 16a,16b and/or 18 may also be patterned, etched and/or removed to form gaps, trenches and/or slices. In this way, the volume of chamber 24 may be adjusted and/or changed without increasing the overall dimensions of MEMS 10. In addition, the getter characteristics may also be modified.

Figure 6:
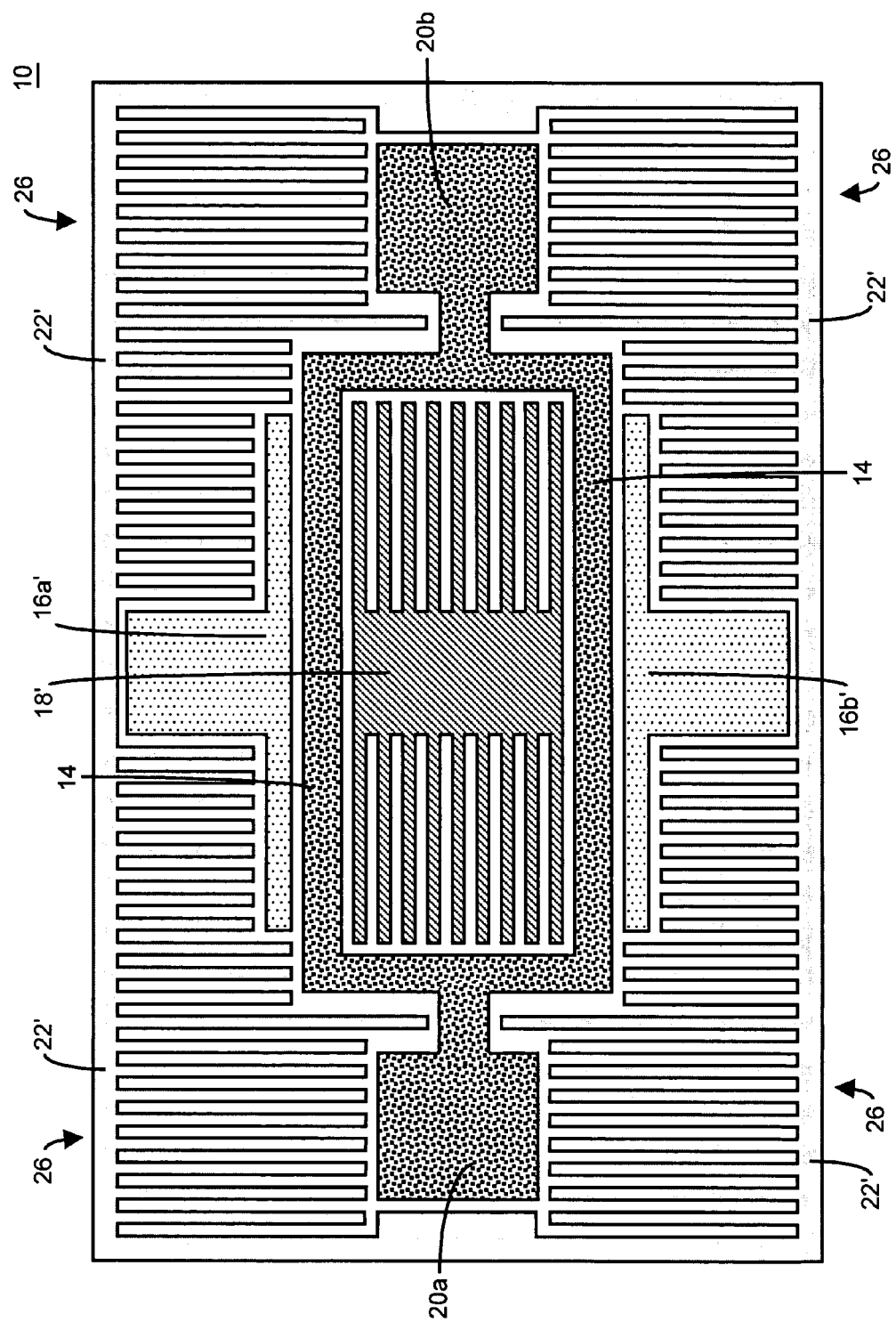
Figure 7:
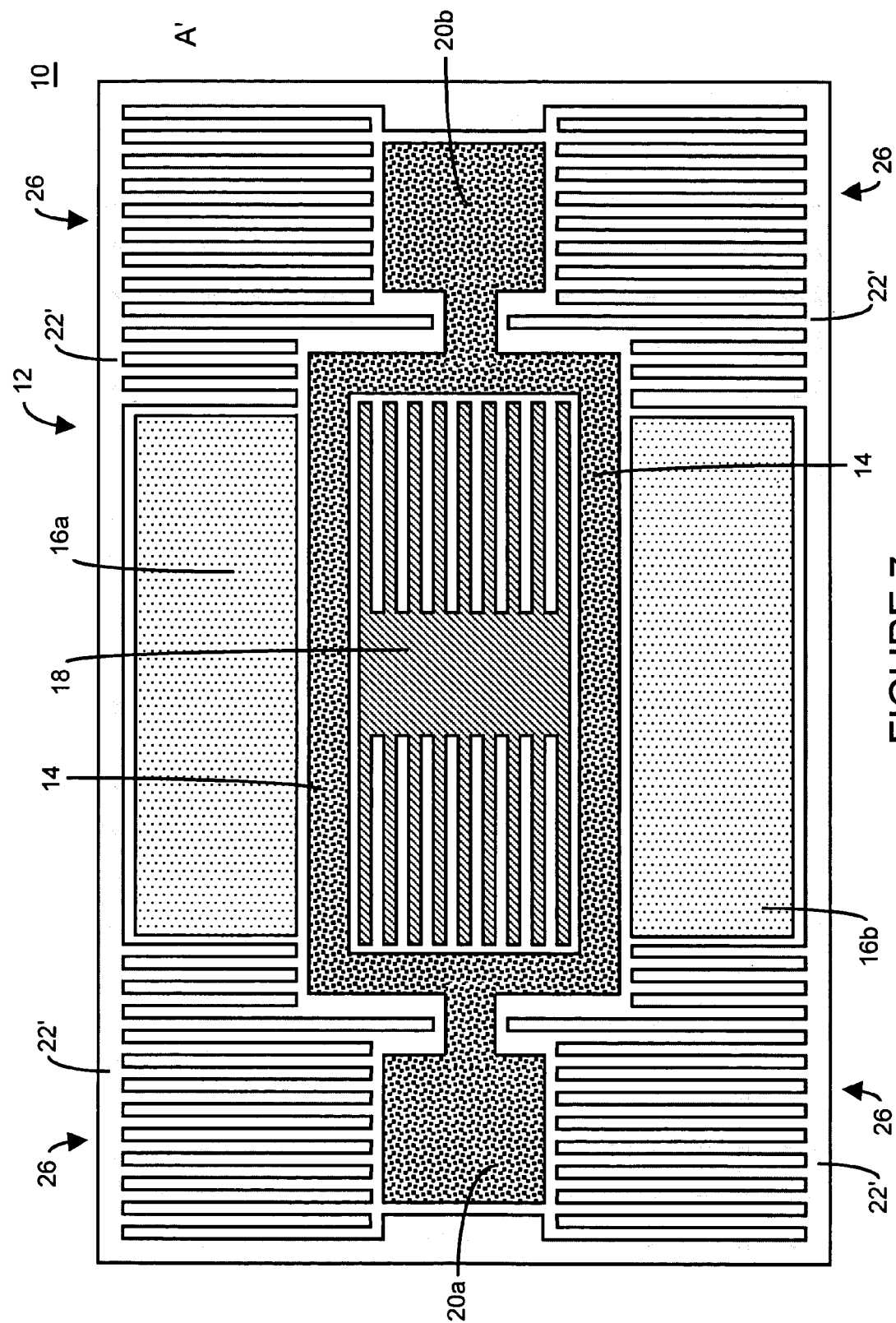
Figure 8:
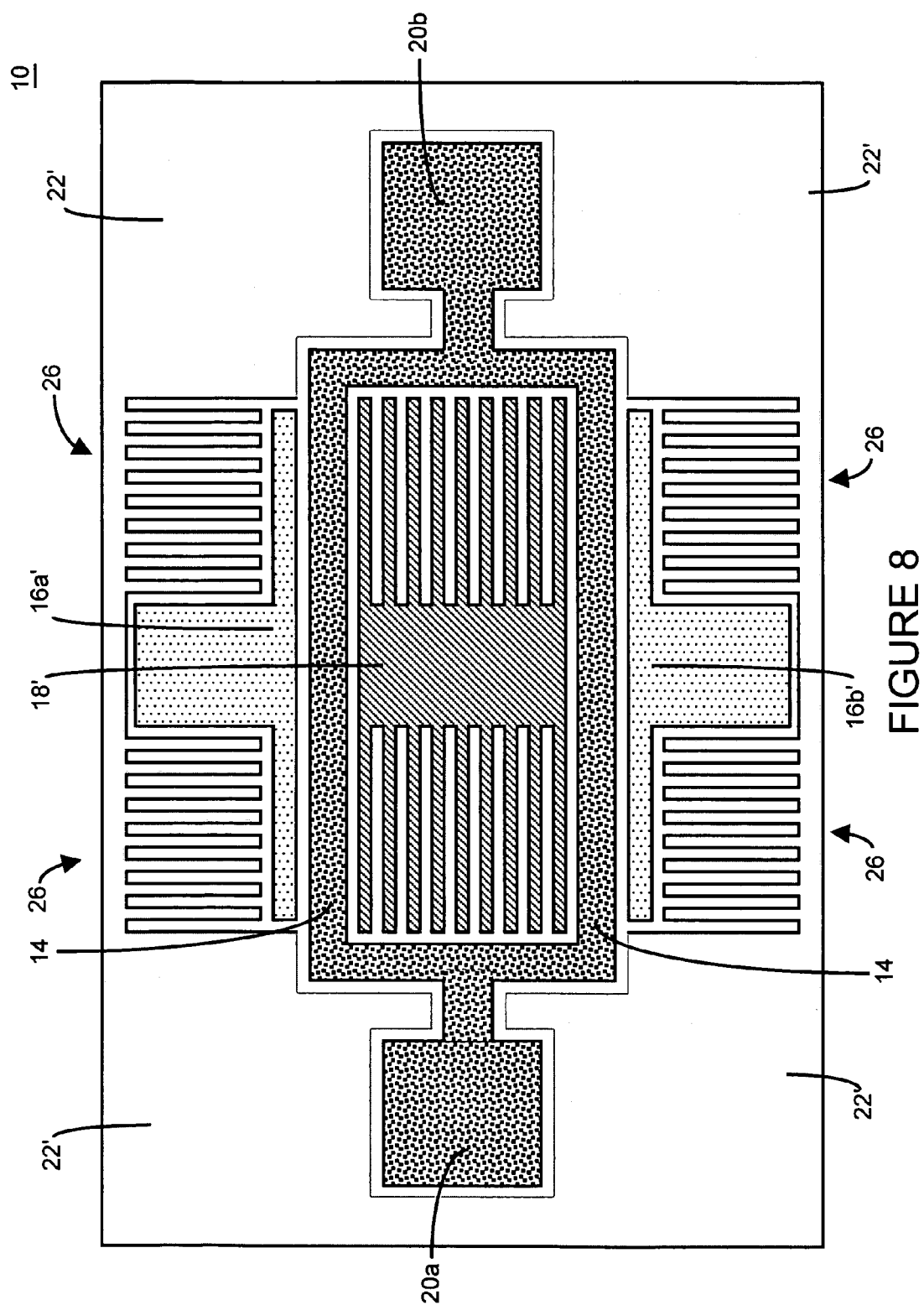
Figure 9:
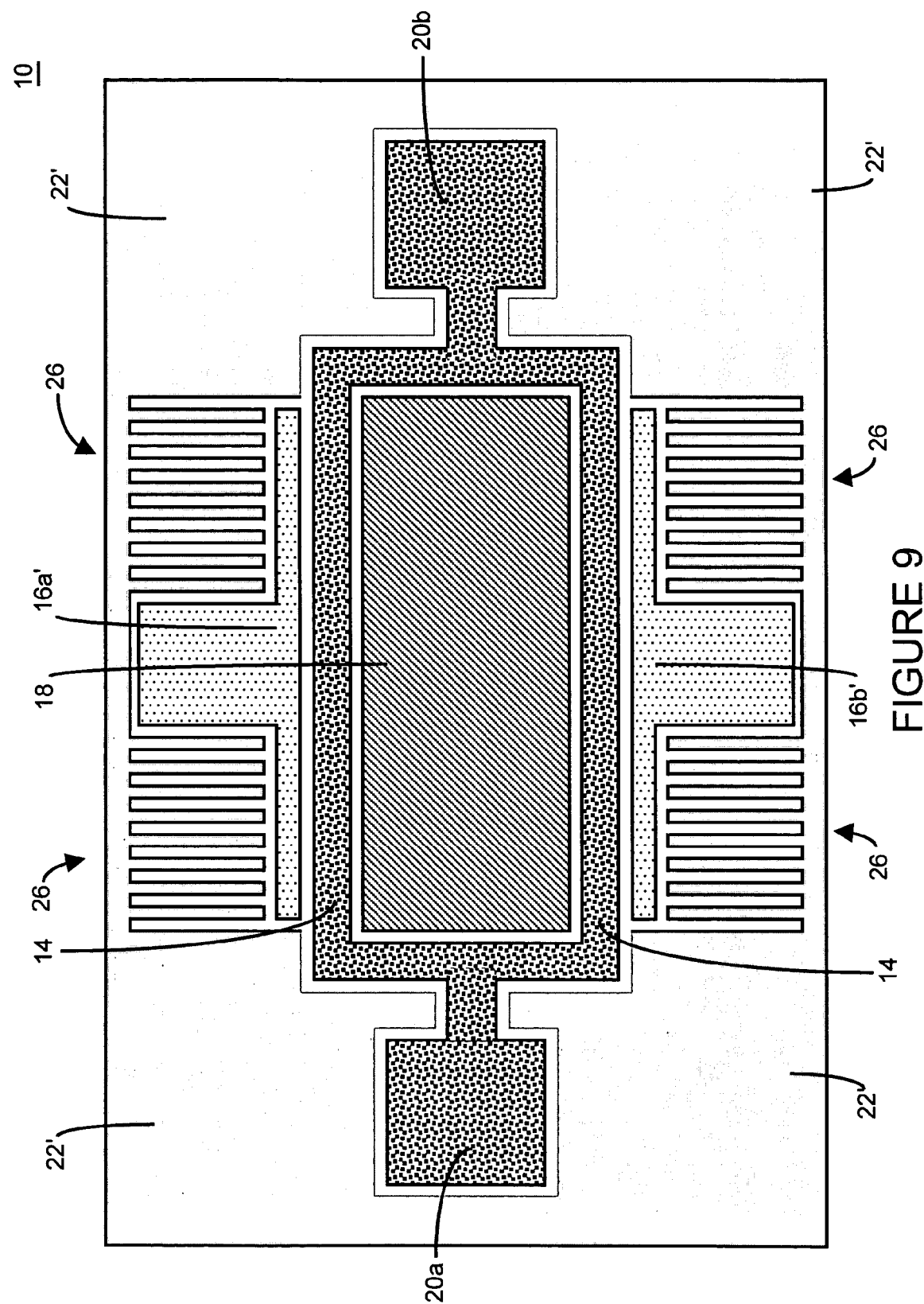

For example, with reference to FIG. 6, portions of fixed electrodes 16a', 16b' and/or 18', and/or periphery area 22' are patterned, etched and/or removed to form gaps, trenches and/or slices. In this embodiment, the volume of chamber 24 may be greater than the volume of chamber 24 of MEMS 10 illustrated in FIG. 2. Moreover, the getter characteristics of MEMS 10 illustrated in FIG. 6 may also be enhanced due to, for example, additional surface area which facilitates diffusion of volatile species in the surrounding solids during subsequent high temperature process steps—which may result in a "cleaner" and/or more pure fluid (from a volatile species perspective) within chamber 24.

Figure 10:
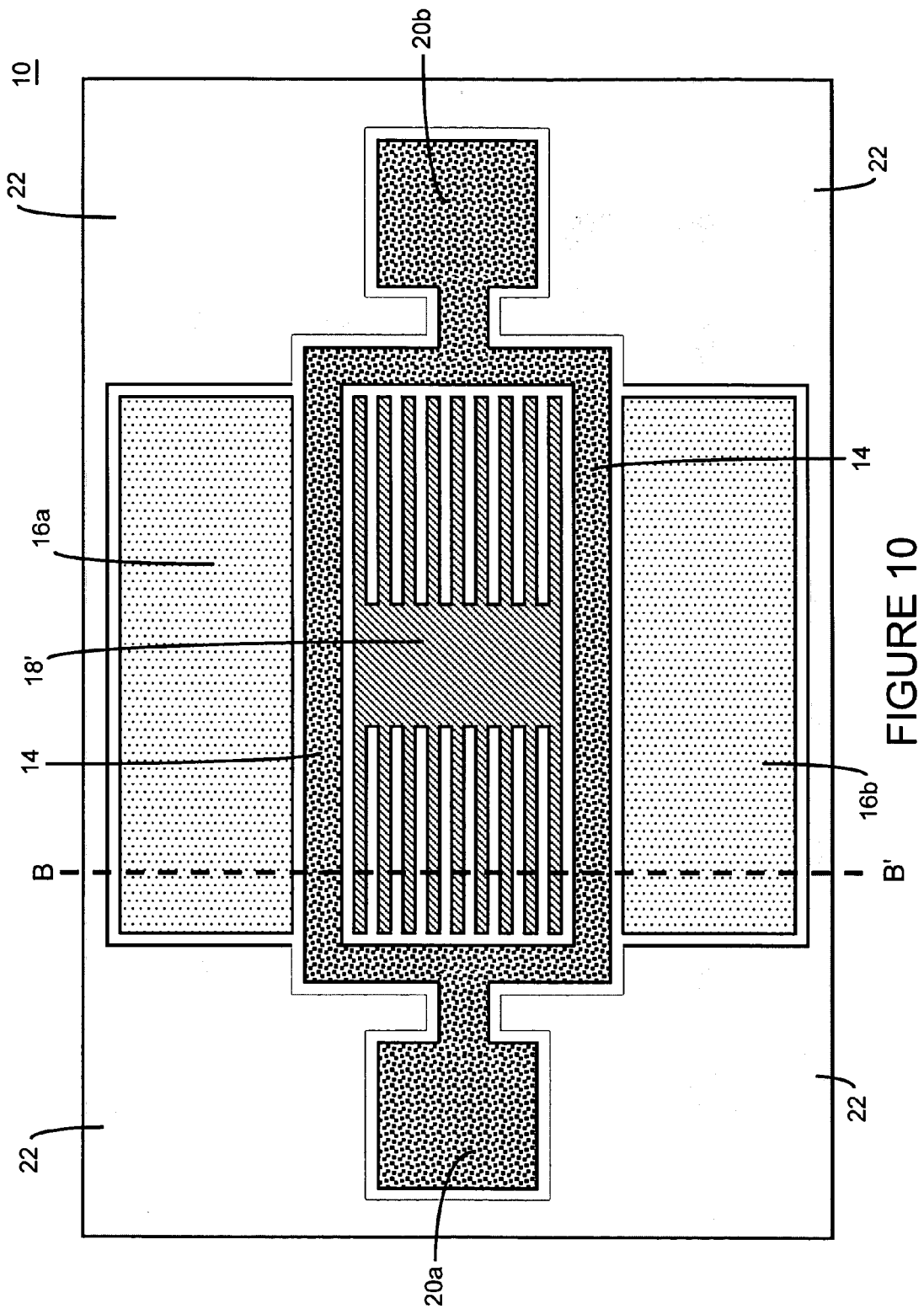
Figure 11:
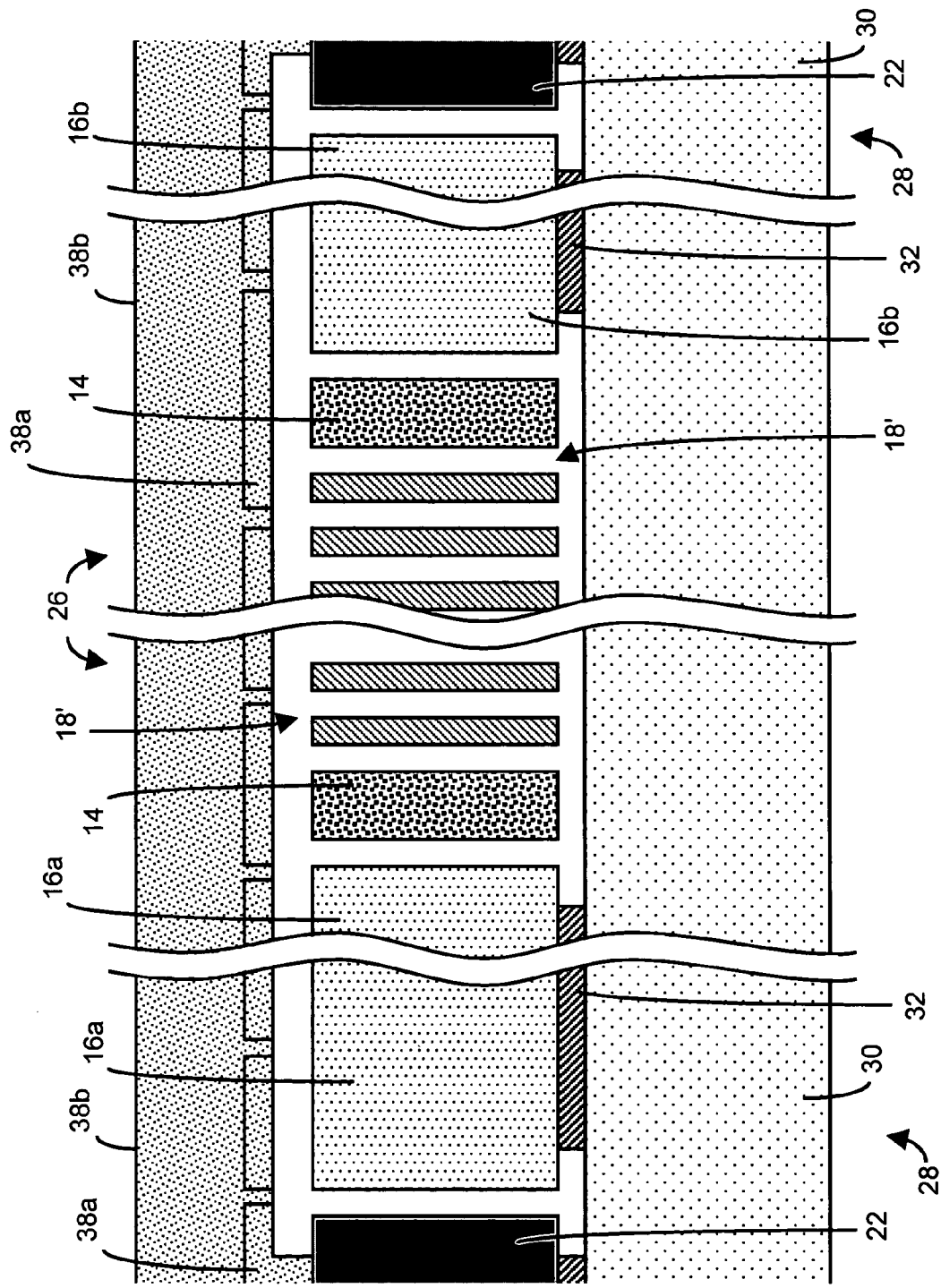
FIG. 11 is a cross-sectional view (sectioned along dotted line B–B' of FIG. 10) of a portion of the periphery area, the fixed electrodes and the moveable electrodes of the MEMS resonator of FIG. 10, in accordance with certain aspects of the present invention.

Moreover, in certain embodiment, it may be advantageous to incorporate or integrated getter area 26 in a certain region juxtaposed moveable electrode 14. With reference to FIGS. 10 and 11, in this embodiment, fixed electrode 18' is patterned, etched and/or removed to form gaps, trenches and/or slices. Such gaps, trenches and/or slices are located within chamber 24 and next to or in the vicinity of moveable electrode 14. In this way, when chamber 24 is "sealed", the overall volume of chamber 24 is greater and the getter characteristics are enhanced (for example, the patterned fixed electrode 18' may substantially reduce the probability of mass loading on the moveable electrode 14 as a result of the increase in the surface area within chamber 24). As mentioned above, by enhancing the getter characteristics of MEMS 10, temperature variations are less likely to cause mass loading (and evaporation of mass). By reducing the probability of mass loading, MEMS 10 is less susceptible to hysteresis, which would limit the performance of a resonator absent compensation.

As mentioned above, MEMS 10 is fabricated using any thin film encapsulation techniques, whether now known or later developed. For example, the present invention may employ the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments of MEMS 10 according to the present invention may be encapsulated using the techniques described and illustrated in Microelectromechanical Systems and Method of Encapsulating Patent Application. Moreover, MEMS 10 according to the present invention may also include or employ the techniques of electrically isolating contact areas and/or field areas from other electrically conductive materials, as described and illustrated in Microelectromechanical Systems and Method of Encapsulating Patent Application. For the sake of brevity, the encapsulation and isolation techniques of Microelectromechanical Systems and Method of Encapsulating Patent Application, implemented in conjunction with the inventions described and illustrated herein, will not be repeated. It is expressly noted, however, that the entire contents of the Microelectromechanical Systems and Method of Encapsulating Patent Application, including, for example, the features, attributes, alternatives, materials, techniques and advantages of all of the embodiments and/or inventions, are incorporated by reference herein.

Figure 12A:
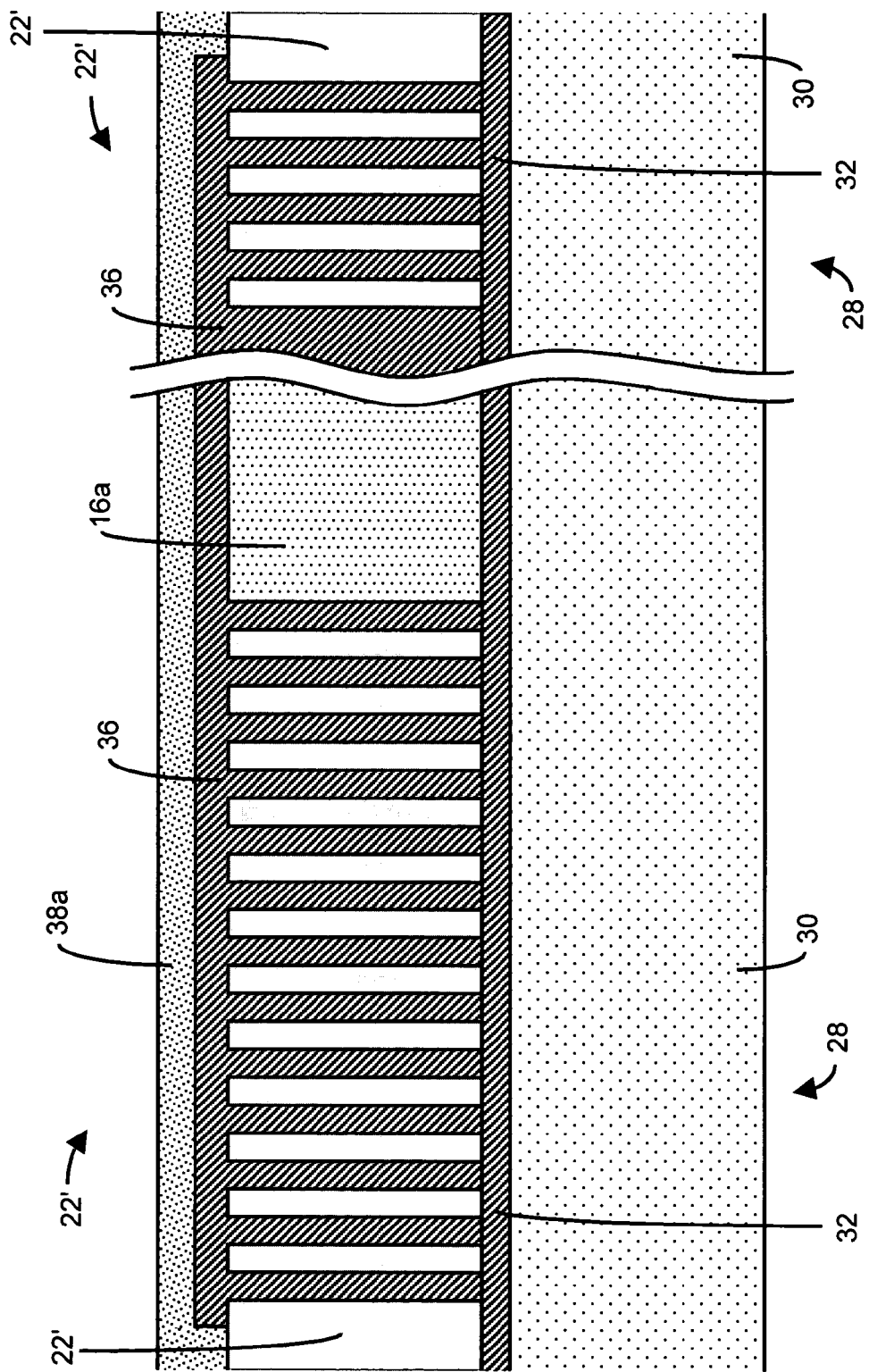
FIGS. 12A–12C illustrate cross-sectional views (sectioned along dotted line A–A' of FIG. 2) of the fabrication of the MEMS of FIG. 2 at various stages of a process that employ other exemplary encapsulation techniques, according to certain aspects of the present invention.
Figure 12B:
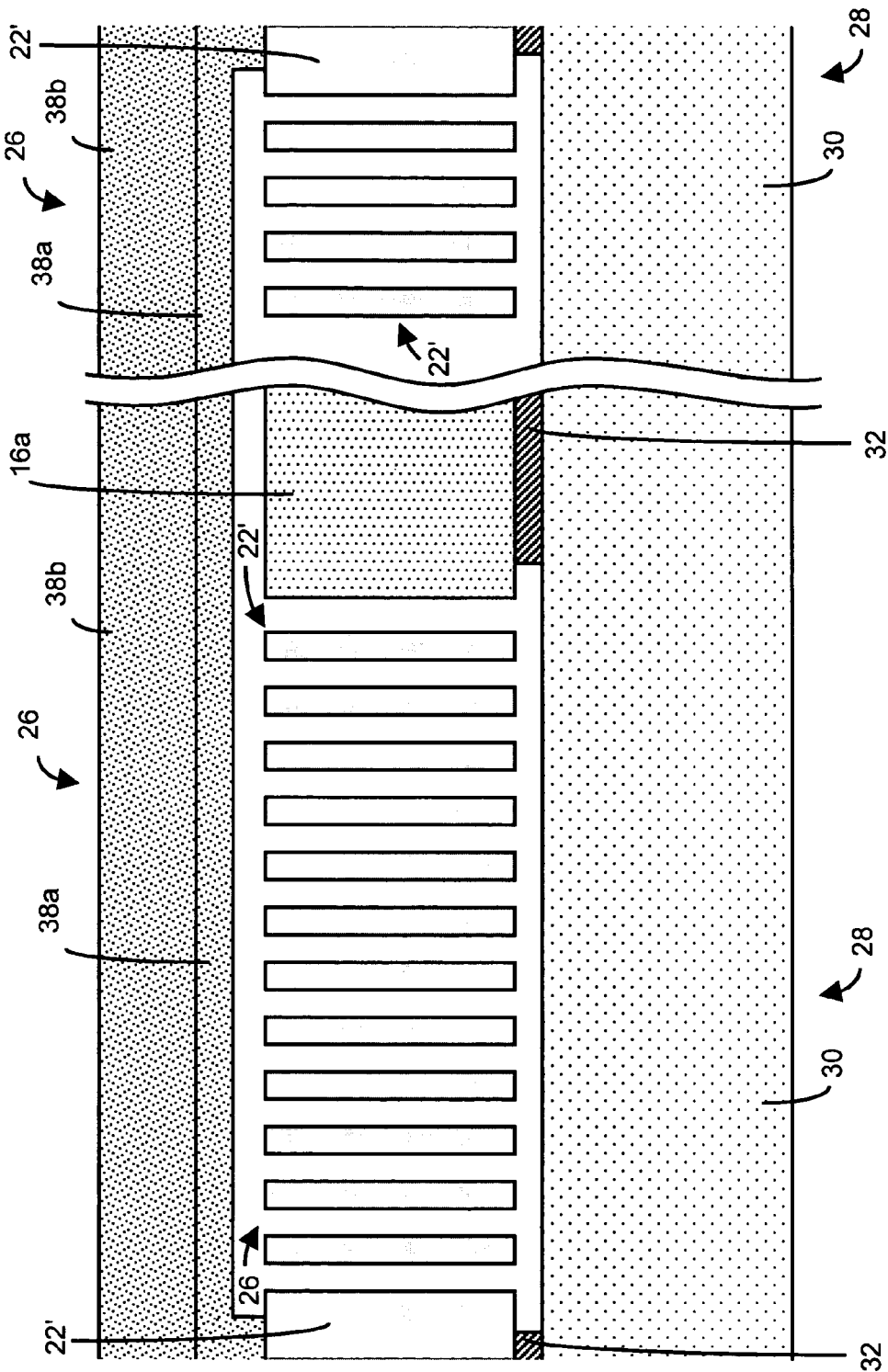

For example, with reference to FIGS. 2, 12A and 12B, MEMS 10 according to the present invention may be encapsulated using first encapsulation layer 38a which is comprised of a permeable or semi-permeable material (for example, an amorphous sputtered silicon or porous CVD and/or epitaxial deposited polycrystalline silicon, having a thickness of between 0.1 µm and 2 µm). The process of etching or removing layers 32 and 36 may be performed through the permeable or semi-permeable material comprising layer 38a. Thereafter, when depositing, forming and/or growing second encapsulation layer 38b (for example, polycrystalline silicon having a thickness of between 5 µm and 25 µm) on first encapsulation layer 38a, the material may migrate to, fill and/or occupy the pores of first encapsulation layer 38a. Under this circumstance, relatively little material may deposit on the surfaces of the structures within chamber 24 during deposition, formation and/or growth of second encapsulation layer 38b. As such, chamber 24 may be "sealed" or encapsulated towards the upper surfaces of first encapsulation layer 38a.

Figure 12C:
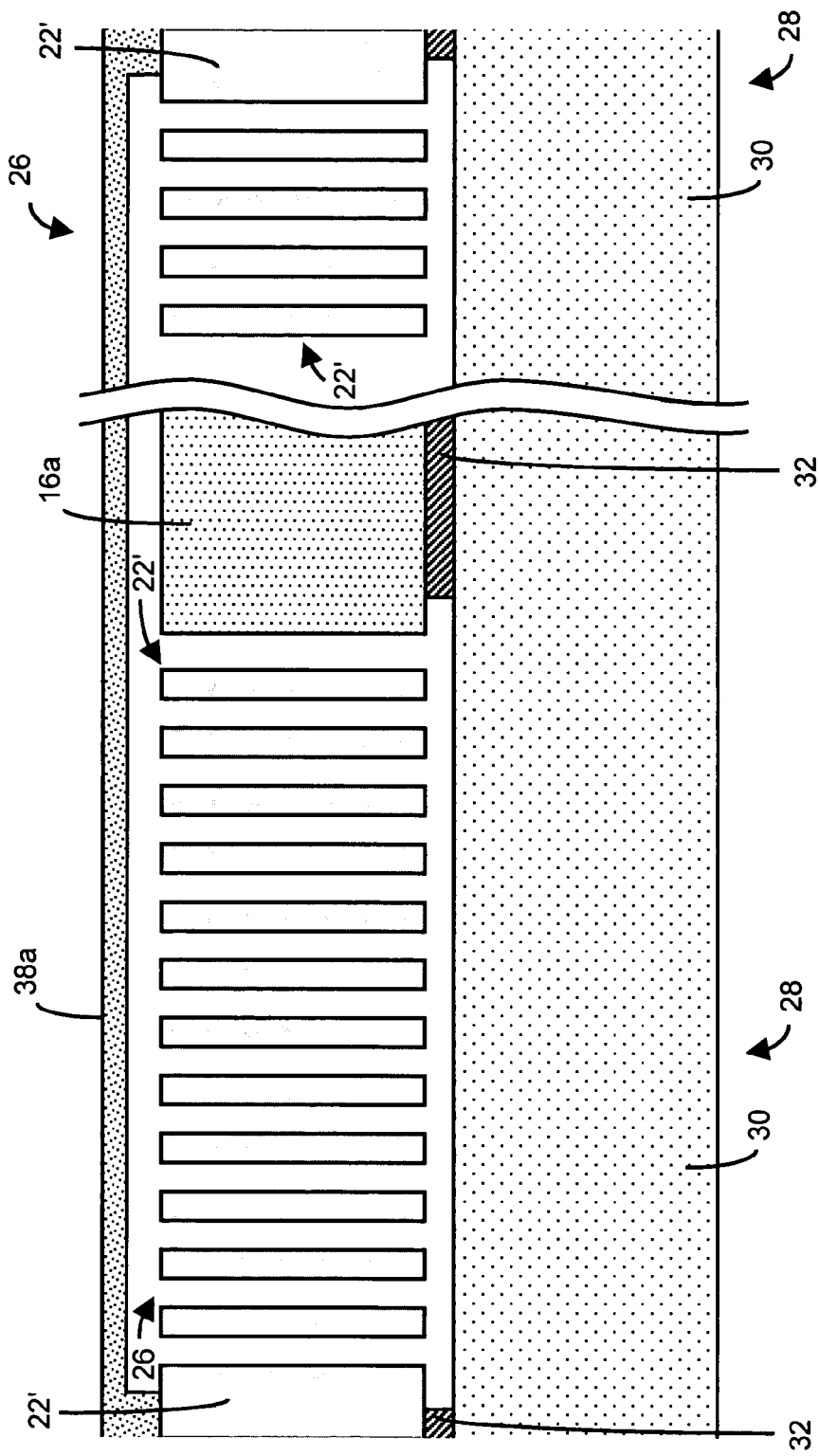

Notably, with reference to FIGS. 2, 12A and 12C, the material comprised of first encapsulation layer 38a may also be densified and thereby "closed" and chamber 24 "sealed" using an annealing process. That is, in this embodiment, heat treating mechanical structure 12, after etching and/or removing sacrificial layers 32 and 36, may cause the material of layer 38a to densify thereby sealing or encapsulating chamber 24. As such, a second encapsulation layer 38b may not be necessary to seal chamber 24.

Figure 13:
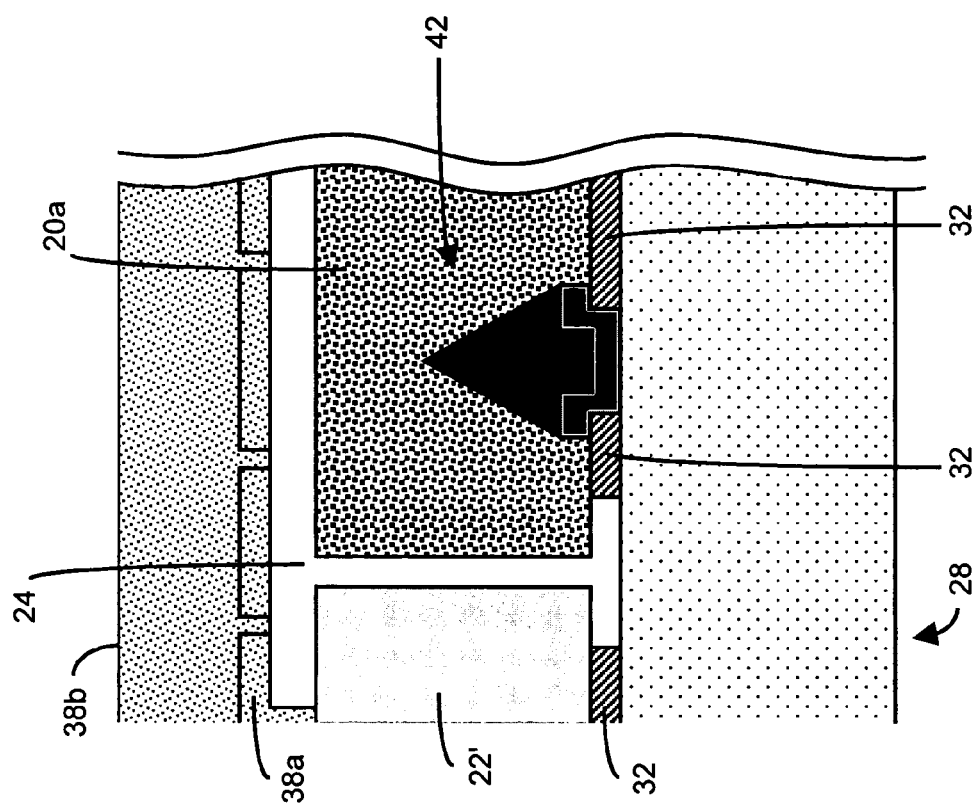
FIG. 13 is a cross-sectional view (sectioned along dotted line C–C' of FIG. 2) of a MEMS of FIG. 2 according to one aspect of the present invention including an exemplary anchor technique for the anchors of the moveable electrodes.

The fixed electrodes 16a, 16b and 18, and anchors 20a and 20b, may employ any form of anchoring techniques, whether now known or later developed. For example, the present invention may employ the encapsulation techniques described and illustrated in non-provisional patent application entitled "Anchors for Microelectromechanical Systems Having an SOI Substrate, and Method for Fabricating Same", which was filed on Jul. 25, 2003 and assigned Ser. No. 10/627,237 (hereinafter "Anchors for Microelectromechanical Systems Patent Application"). In this regard, with reference to FIG. 13, any and all of the embodiments of MEMS 10 according to the present invention may be anchored to SOI substrate 28 using anchors 42 as described and illustrated in Anchors for Microelectromechanical Systems Patent Application. For the sake of brevity, the anchoring techniques of Anchors for Microelectromechanical Systems Patent Application, implemented in conjunction with the inventions described and illustrated herein, will not be repeated in detail. It is expressly noted, however, that the entire contents of the Anchors for Microelectromechanical Systems Patent Application, including, for example, the features, attributes, alternatives, materials, techniques and advantages of all of the embodiments and/or inventions, are incorporated by reference herein.

Figure 14:
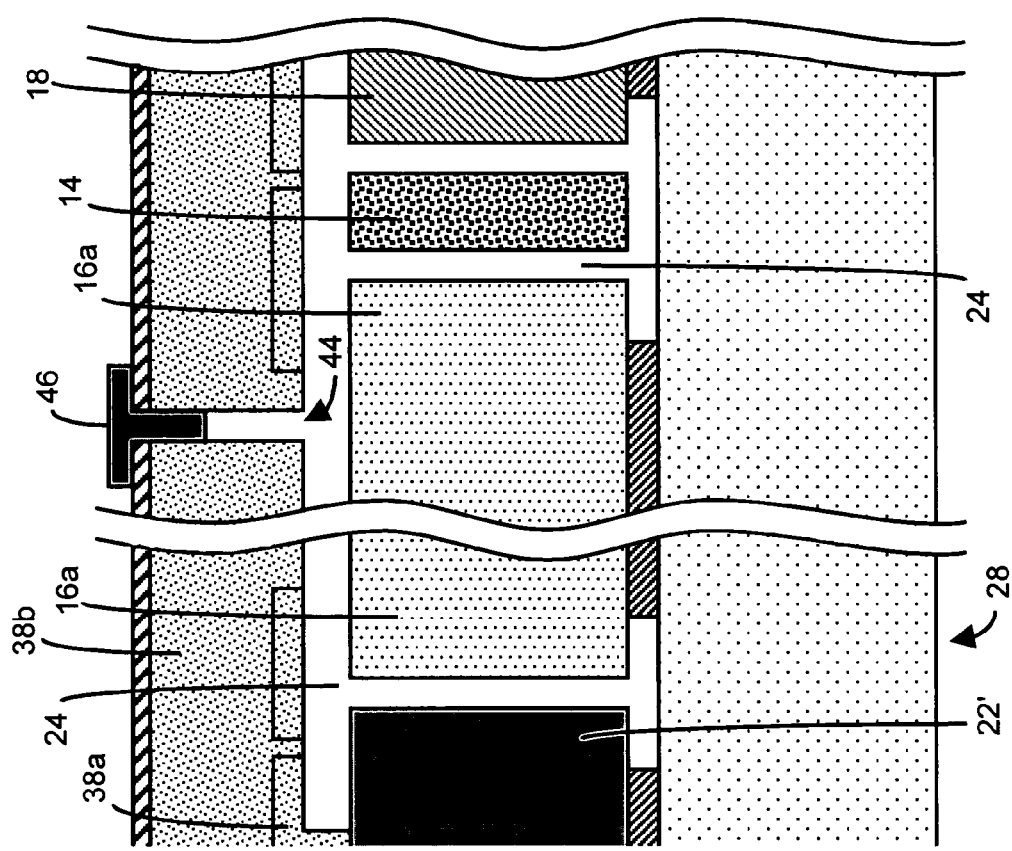
FIG. 14 is a cross-sectional view (sectioned along dotted line B–B' of FIG. 2) of a MEMS of FIG. 2 according to one aspect of the present invention including exemplary anti-stiction techniques.
Figure 15A:
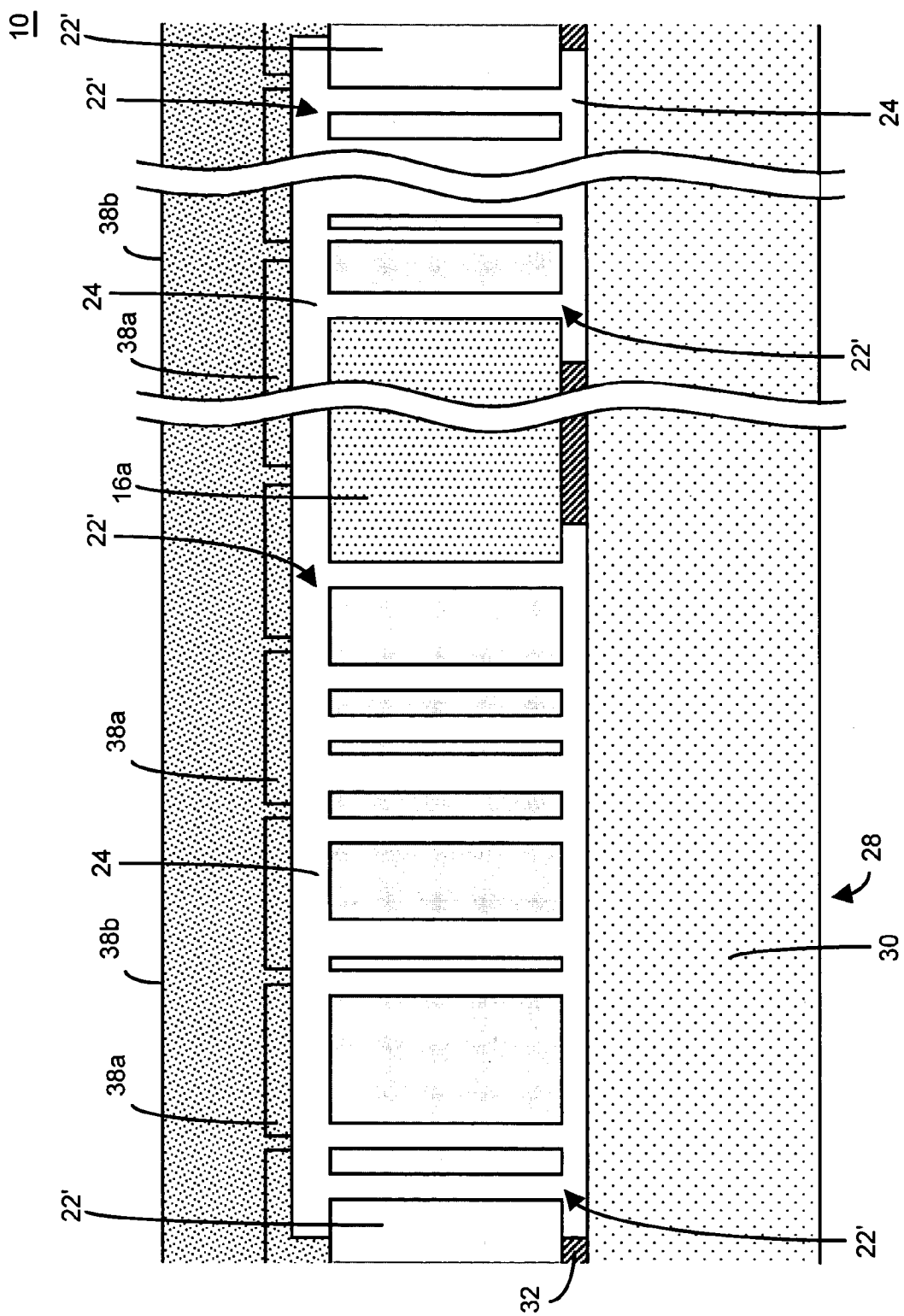
FIGS. 15A–15E illustrate cross-sectional views of a MEMS (sectioned along dotted line A–A' of FIG. 2) according to one aspect of the present invention illustrating various and exemplary patterns, shapes and/or depths of the gaps, trenches and/or slices in periphery area.
Figure 15B:
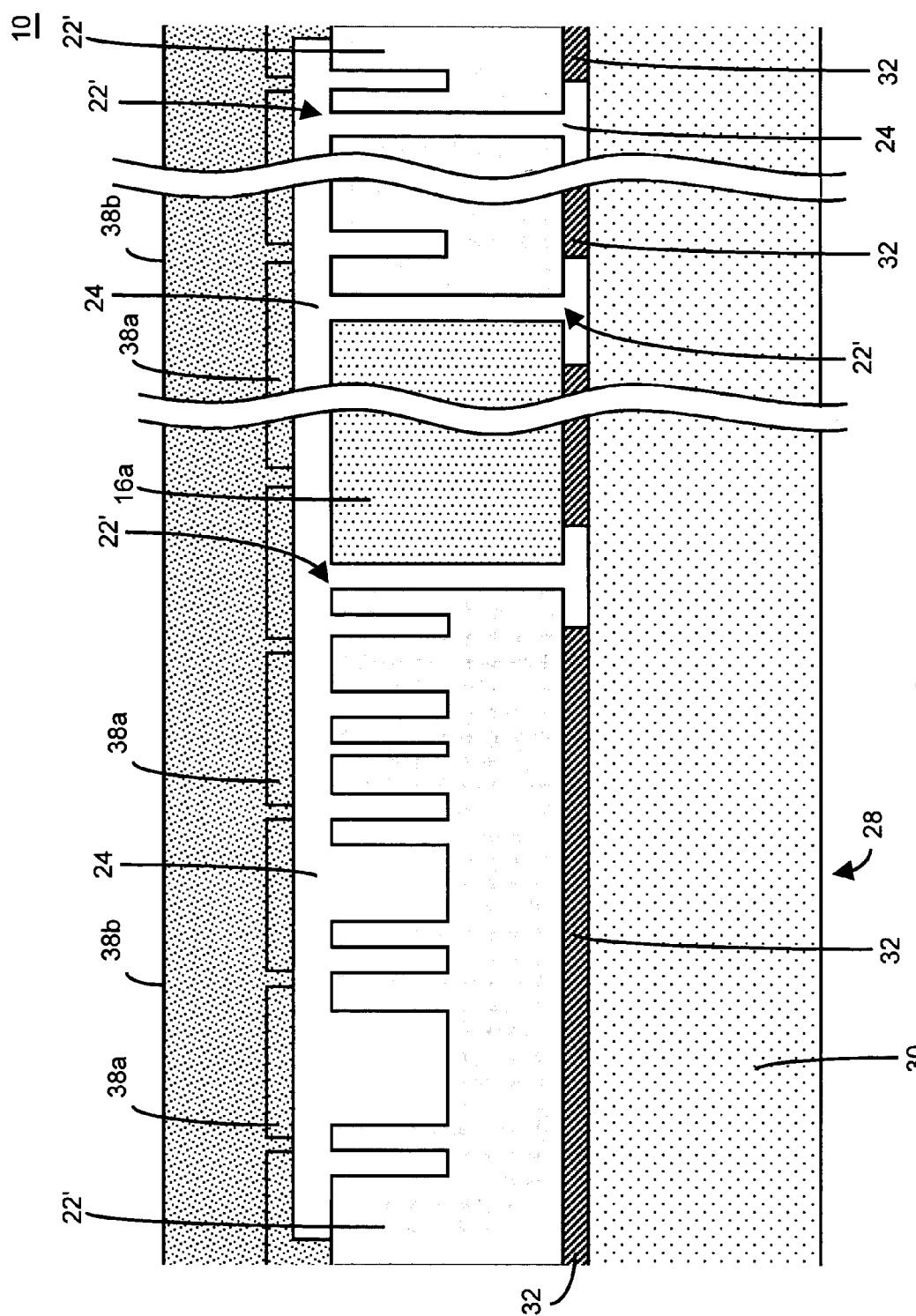
Figure 15C:
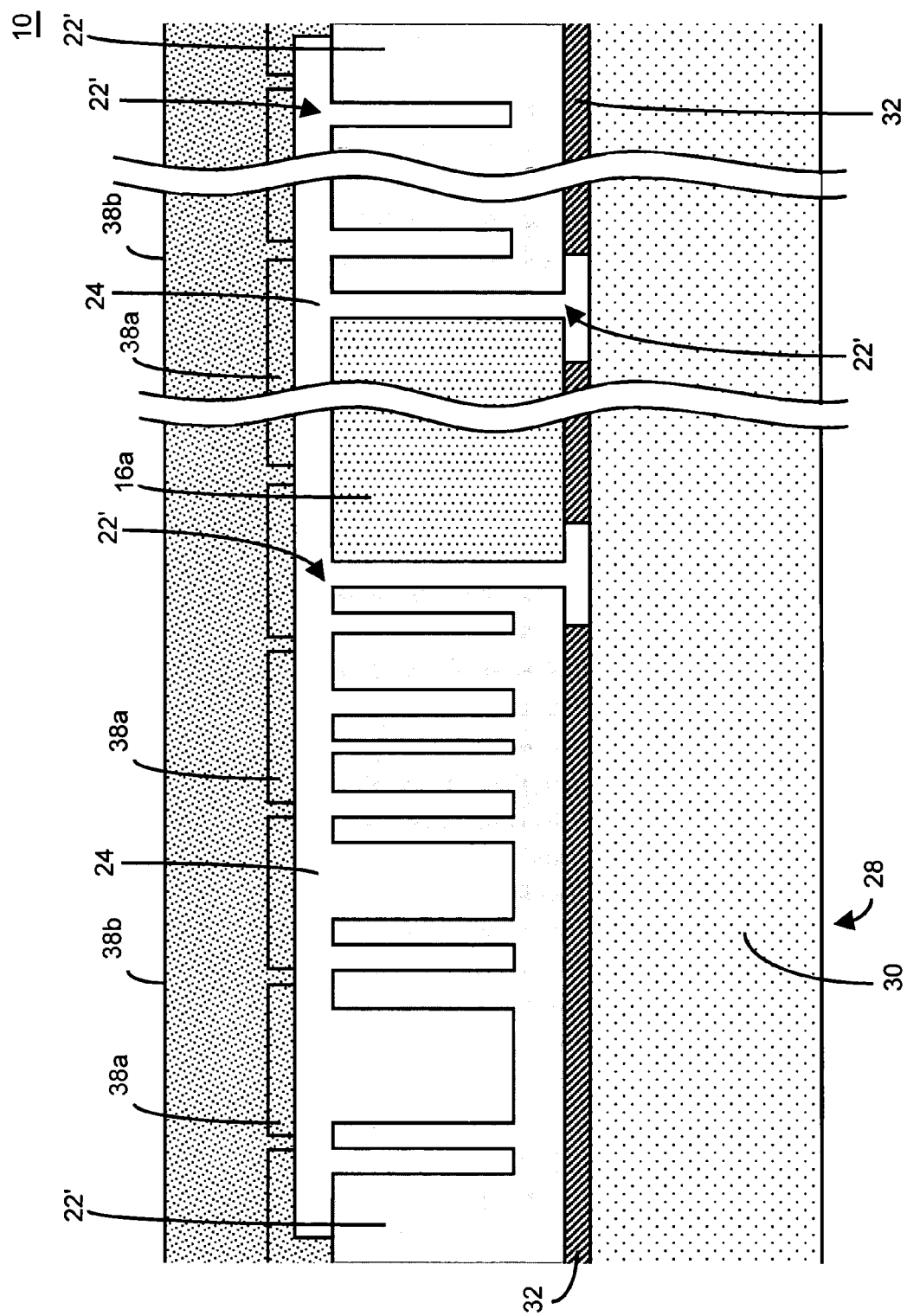
Figure 15D:
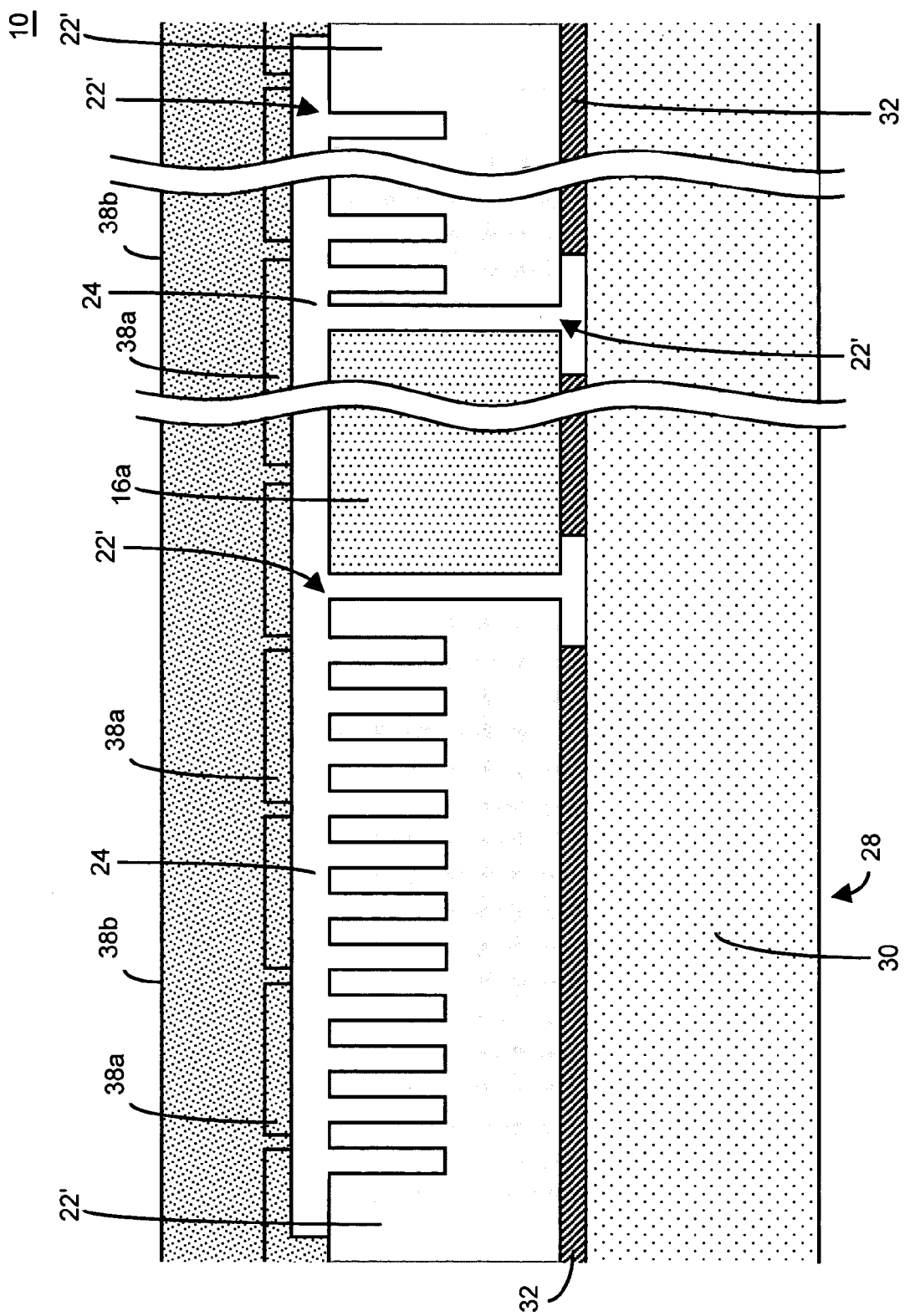
Figure 15E:
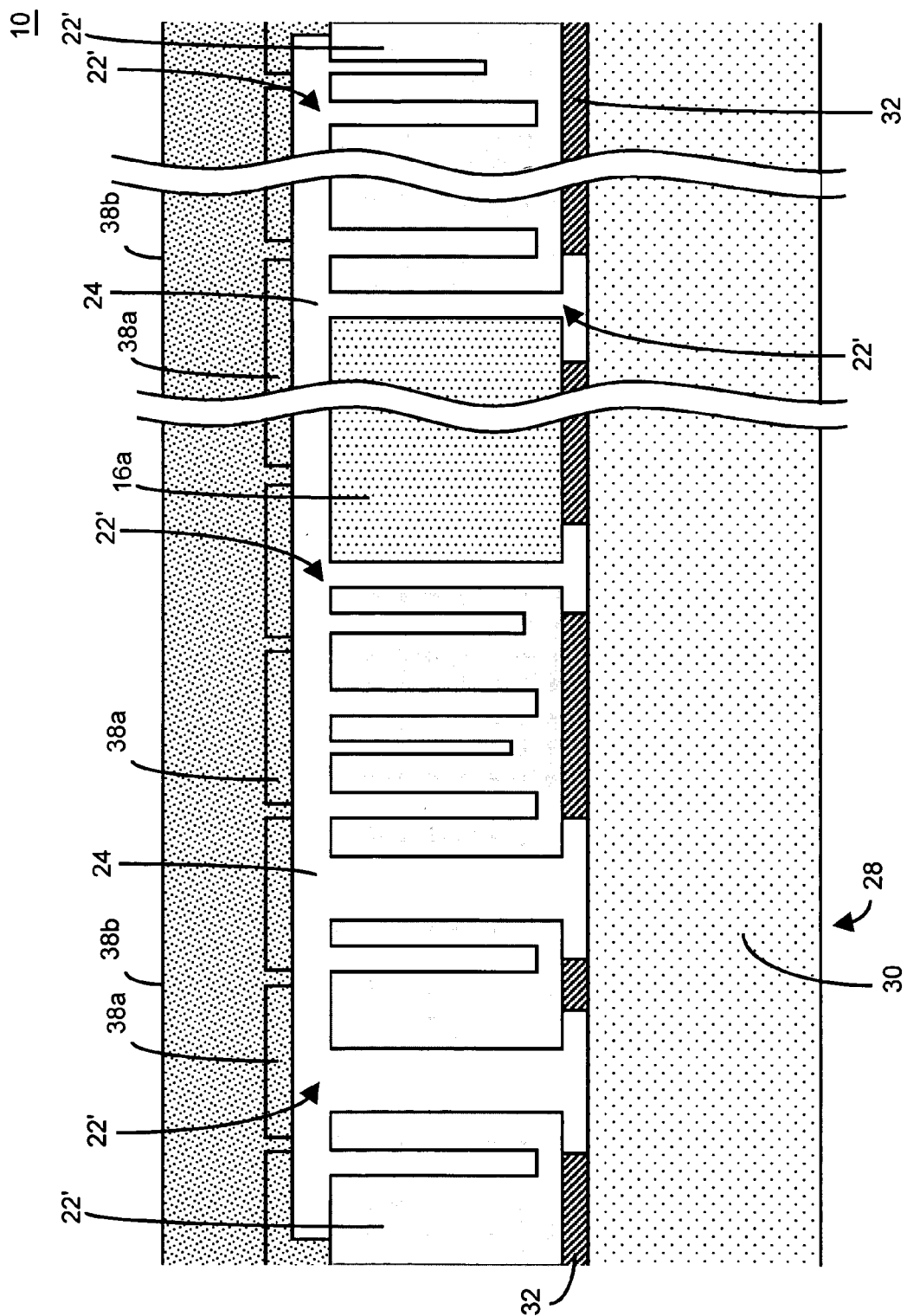

It may be advantageous to employ anti-stiction techniques in conjunction with MEMS 10 of the present inventions to further enhance the operation and/or reliability of MEMS 10. For example, the MEMS of the present inventions may include or employ the anti-stiction techniques described and illustrated in non-provisional patent application entitled "Anti-Stiction Technique for Thin Film and Wafer-Bonded Encapsulated Microelectromechanical Systems" (hereinafter the "Anti-Stiction Technique for Microelectromechanical Systems Patent Application"), which was filed on Oct. 31, 2003 and assigned Ser. No. 10/698,258. In this regard, with reference to FIG. 14, in one embodiment, after encapsulation of the MEMS, anti-stiction channel 44 is formed in the encapsulation layer(s) and/or the substrate as described in the Anti-Stiction Technique for Microelectromechanical Systems Patent Application. The anti-stiction channel 44 provides "access" to chamber 24 containing some or all of electrodes 14, 16a and 16b of mechanical structure 12. Thereafter, as described in detail in the Anti-Stiction Technique for Microelectromechanical Systems Patent Application, an anti-stiction fluid (for example, gas or gas-vapor) is introduced into chamber 24 via anti-stiction channel 44. The anti-stiction fluid may deposit on one, some or all of electrodes 14, 16a and 16b thereby providing an anti-stiction layer (for example, a monolayer coating or self-assembled monolayer) and/or out-gassing molecules on such electrodes. In this way, mechanical structure 12 includes suitable anti-stiction characteristics.

After introduction and/or application of the anti-stiction fluid, anti-stiction channel may be sealed, capped, plugged and/or closed, using anti-stiction plug 46 in order to define and control the mechanical damping environment within chamber 24. In this regard, sealing, capping and/or closing the chamber establishes the environment within chamber 24 containing and/or housing mechanical structures 12. This environment provides the predetermined, desired and/or selected mechanical damping of mechanical structure 12 as well as suitable hermeticity. The parameters (for example, pressure) of the final encapsulated fluid (for example, a gas or a gas vapor) in which mechanical structures 12 are to operate may be controlled, selected and/or designed to provide a desired and/or predetermined operating environment, for example, suing the techniques described and illustrated in the Electromechanical System having a Controlled Atmosphere Patent Application.

Notably, any and all of the embodiments of MEMS 10 according to the present invention may include and/or incorporate the anti-stiction techniques described and illustrated in the Anti-Stiction Technique for Microelectromechanical Systems Patent Application. For the sake of brevity, the anti-stiction techniques of the Anti-Stiction Technique for Microelectromechanical Systems Patent Application, implemented in conjunction with the inventions described and illustrated herein, will not be repeated in detail. It is expressly noted, however, that the entire contents of the Anti-Stiction Technique for Microelectromechanical Systems Patent Application, including, for example, the features, attributes, alternatives, materials, techniques and advantages of all of the embodiments and/or inventions, are incorporated by reference herein.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

For example, as mentioned above, although the gaps, trenches and/or slices in fixed electrodes 16a', 16b' and/or 18', and/or periphery area 22' are illustrated as a repeating pattern, extending to the surface of first sacrificial/insulation layer 32, any pattern, shape and/or depth of the gaps, trenches and/or slices may be employed. (See, for example, FIGS. 15A–15C and 15E). It may be advantageous, however, to form the gaps, trenches and/or slices in fixed electrodes 16a', 16b' and/or 18', and/or periphery area 22' during the same lithographic and etching process that forms other portions of mechanical structure 12 (for example, moveable electrode 14). In this way, the number of process steps may be reduced and/or not increased. Notably, due to micro loading effects by using smaller gaps (smaller gaps etch slower than wide gaps) for the getter area, the features illustrated in FIGS. 15A–15C and 15E, for example, may be achieved using one lithographic and etching process.

Figure 16A:
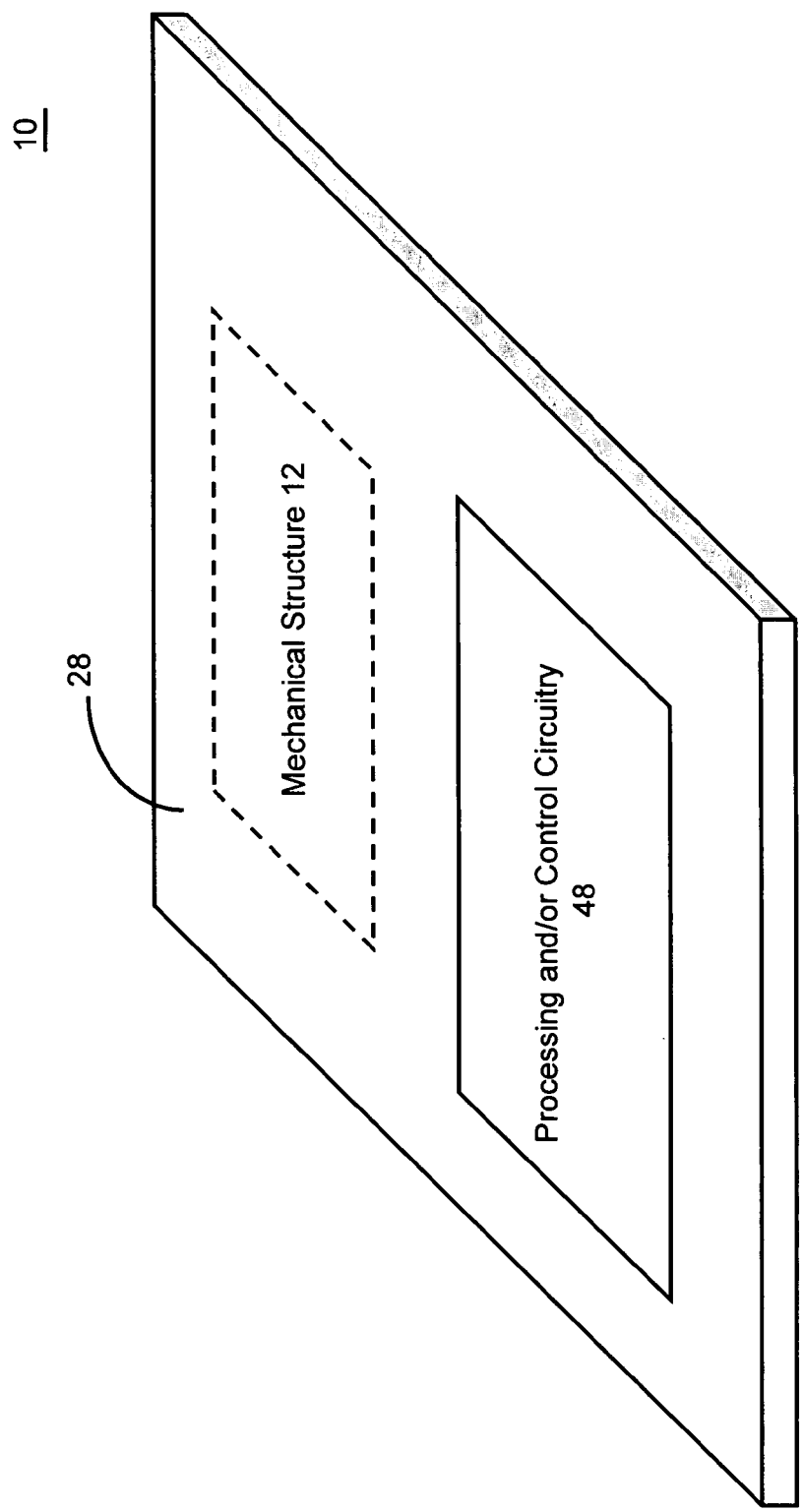
FIG. 16A is a block diagram of exemplary MEMS including a mechanical structure and processing and control circuitry integrated on a common substrate, according to one aspect of the present invention.

It should be noted that the present invention may be implemented in a MEMS including micromachined mechanical structure and processing and/or control circuitry. With reference to FIG. 16A, in one exemplary embodiment, MEMS 10 includes micromachined mechanical structure 12 that is disposed on, for example, SOI substrate 28. The MEMS 10 of this embodiment also include processing and/or control circuitry 48 to interact with micromachined mechanical structure 12, for example, process and analyze information generated by, and/or control or monitor the operation of micromachined-mechanical structure 12.

In one embodiment where mechanical structure 12 is a MEMS resonator, the processing and/or control circuitry may include compensation and control circuitry as described and illustrated in non-provisional patent application entitled "Frequency and/or Phase Compensated Microelectromechanical Oscillator", which was filed on Jan. 9, 2004 and assigned Ser. No. 10/754,985 (hereinafter the "Frequency and/or Phase Compensated Microelectromechanical Oscillator Patent Application"). The MEMS resonator described and illustrated in this application may be implemented in the MEMS described and illustrated in the Frequency and/or Phase Compensated Microelectromechanical Oscillator Patent Application wherein the output of the MEMS resonator is frequency and/or phase compensated to provide a highly accurate, stable, controllable, programmable, definable and/or selectable output signal(s). For the sake of brevity, the inventions described and illustrated in the Frequency and/or Phase Compensated Microelectromechanical Oscillator Patent Application, implemented in conjunction with the inventions described and illustrated herein, will not be repeated in detail. It is expressly noted, however, that the entire contents of the Frequency and/or Phase Compensated Microelectromechanical Oscillator Patent Application, including, for example, the features, attributes, alternatives, materials, techniques and advantages of all of the inventions, are incorporated by reference herein.

Figure 16B:
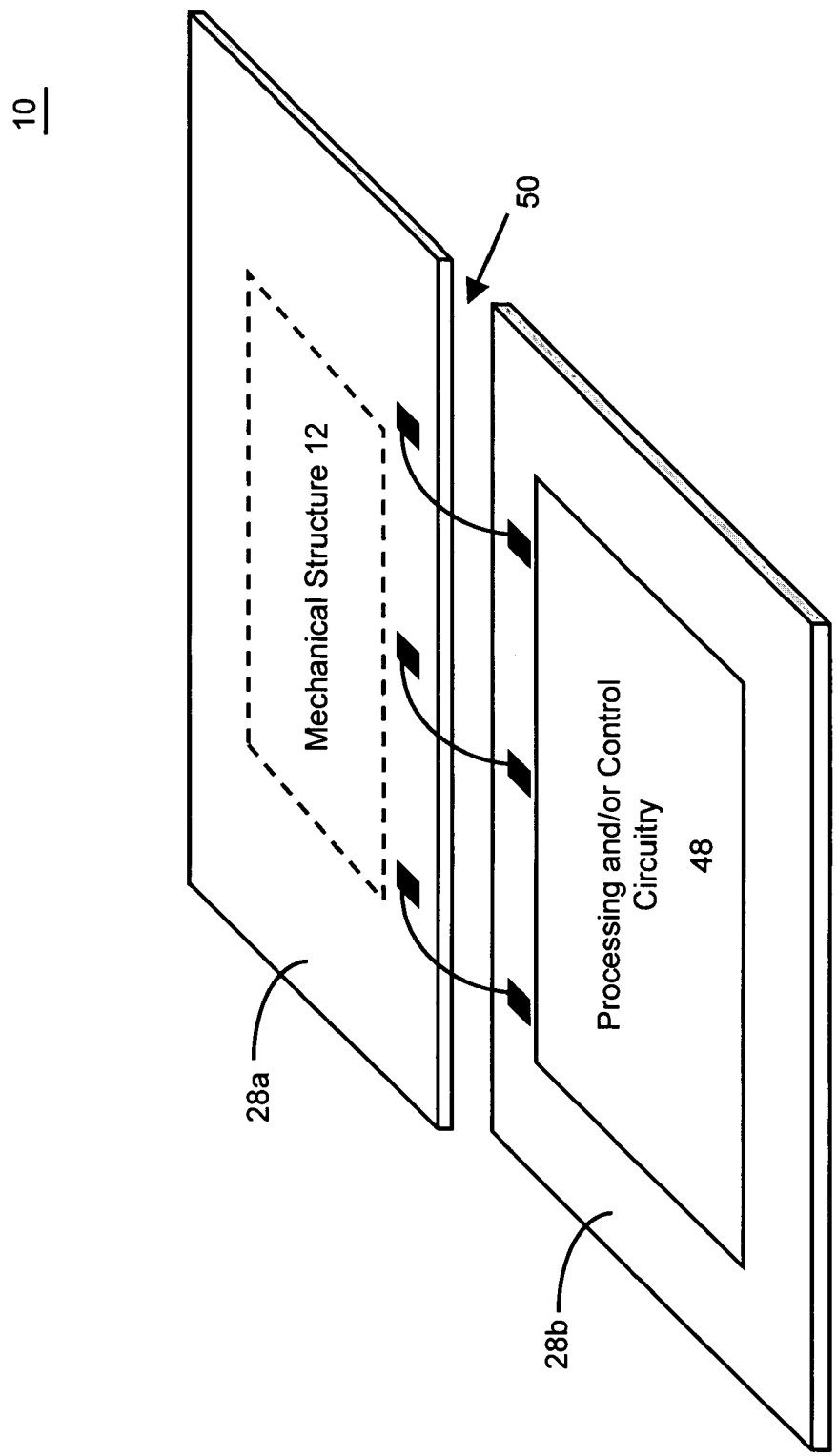
FIGS. 16B and 16C are block diagrams of exemplary MEMS including mechanical structures and processing and control circuitry disposed on separate substrates, according to certain aspects of the present invention.
Figure 16C:
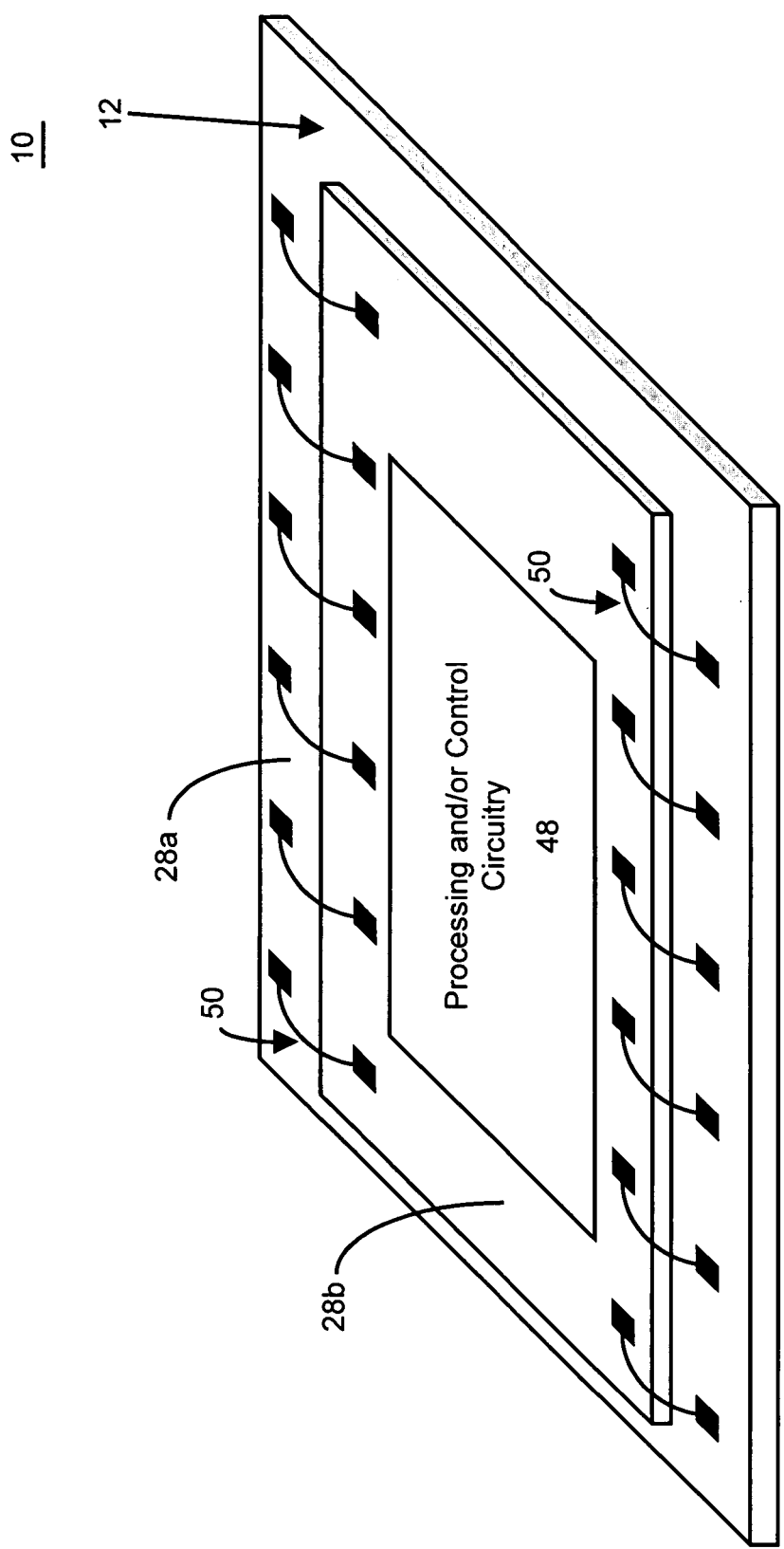

Notably, with reference to FIGS. 16B and 16C, micromachined mechanical structure 12 and processing and/or control circuitry 48 may be disposed on separate substrates, namely 28a and 28b. The MEMS 10 of this embodiment includes mechanical structure 12 and processing and/or control circuitry 48 fabricated on separate substrates wherein various signals may be exchanged using wire interconnects 50 electrically interconnecting bond pads located on substrates 28a and 28b.

As mentioned above, the MEMS of the present invention may employ the encapsulation techniques described and illustrated in non-provisional patent application entitled Microelectromechanical Systems Having Trench Isolated Contacts, and Methods of Fabricating Same. Moreover, the MEMS of the present invention may also include or employ the techniques of electrically isolating contact areas and/or field areas from other electrically conductive materials that are described and illustrated in Microelectromechanical Systems Having Trench Isolated Contacts, and Methods of Fabricating Same. For the sake of brevity, the encapsulation and isolation techniques of Microelectromechanical Systems and Method of Encapsulating Patent Application, implemented in conjunction with the inventions described and illustrated herein, are not be repeated. It is again expressly noted that the entire contents of the Microelectromechanical Systems Having Trench Isolated Contacts, and Methods of Fabricating Same, including, for example, the features, attributes, alternatives, materials, techniques and advantages of all of the embodiments and/or inventions, are incorporated by reference.

The term "depositing" and other forms (i.e., deposit, deposition and deposited) in the claims, means, among other things, depositing, creating, forming and/or growing a layer of material using, for example, a reactor (for example, an epitaxial, a sputtering or a CVD-based reactor (for example, APCVD, LPCVD, or PECVD)). All deposition techniques, for depositing the various layers and/or materials, whether now known or later developed, are intended to be within the scope of the present invention.

While the exemplary embodiments of the present inventions have been described in the context of microelectromechanical systems including micromechanical structures or elements, the present inventions are not limited in this regard. Rather, the inventions described herein are applicable to other electromechanical systems including, for example, nanoelectromechanical systems. Thus, the present inventions are pertinent to electromechanical systems, for example, gyroscopes, resonators, temperatures sensors and/or accelerometers, made in accordance with fabrication techniques, such as lithographic and other precision fabrication techniques, which reduce mechanical components to a scale that is generally comparable to microelectronics.

Moreover, MEMS 10 may include a plurality of micromachined mechanical structures, for example, one or more transducers (for example, strain sensor, tactile sensor, magnetic sensor and/or temperature sensor), and/or resonators. Indeed, the mechanical structures of the one or more transducers and/or resonators may themselves include multiple layers that are vertically and/or laterally stacked, and/or interconnected, within chamber 24. (See, for example, micromachined mechanical structures of FIGS. 11A–11C, and mechanical structures, contact areas, and buried contacts of FIG. 11D of the Microelectromechanical Systems and Method of Encapsulating Patent Application; as noted above, the entire contents of the Microelectromechanical Systems and Method of Encapsulating Patent Application, including, for example, the features, attributes, alternatives, materials, techniques and advantages of all of the embodiments and/or inventions, are incorporated by reference herein). The mechanical structures of these embodiments may be fabricated using one or more processing steps to provide the vertically and/or laterally stacked active elements, and/or interconnected multiple active layers.

Finally, it should be further noted that while the present inventions have been described in connection with SOI, other substrates are suitable. For example, the first semiconductor layer may be materials in column IV of the periodic table, for example, silicon, germanium, carbon; also combinations of these, for example, silicon germanium, or silicon carbide; also of III–V compounds, for example, gallium phosphide, aluminum gallium phosphide, or other III–V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped). Indeed, the first semiconductor layer may also be a metal or metal type material (in which case it would be a first conductor layer disposed on the first substrate layer). Notably, the mechanical structure may be comprised of the same materials as described above with respect to the first semiconductor layer.

What is claimed is:

1. A microelectromechanical device comprising:
a substrate;
a mechanical structure disposed over the substrate, wherein at least a portion of the mechanical structure is disposed in a chamber;
a fluid disposed in the chamber;
a periphery area disposed over the substrate, wherein the periphery area includes a plurality of gaps therein, wherein the plurality of gaps is disposed in the chamber and exposed to the fluid; and
a thin film encapsulation structure, disposed over the mechanical structure and the periphery area, to partially define and seal the chamber, wherein the fluid is contained in the chamber after the chamber is sealed.

2. The device of claim 1 wherein the thin film encapsulation structure includes first and second encapsulation layers.

3. The device of claim 2 wherein the first encapsulation layer includes polycrystalline silicon, porous polycrystalline silicon, amorphous silicon, silicon carbide, silicon nitride, silicon/germanium, germanium, or gallium arsenide.

4. The device of claim 2 wherein the second encapsulation layer includes polycrystalline silicon, porous polycrystalline silicon, amorphous silicon, germanium, silicon/germanium, gallium arsenide, or silicon carbide.

5. The device of claim 1 wherein the mechanical structure includes at least one fixed electrodes, wherein the at least one fixed electrodes includes a plurality of gaps therein, wherein the plurality of gaps in the at least one fixed electrode is disposed in the chamber and exposed to the fluid.

6. The device of claim 1 wherein the mechanical structure includes at least one anchor region, wherein the at least one anchor region includes a plurality of gaps therein, and wherein the plurality of gaps in the at least one anchor region is disposed in the chamber and exposed to the fluid.

7. The device of claim 1 wherein the mechanical structure is a resonator including at least one fixed electrode, at least one anchor region, and at least one moveable electrode that is physically connected to the anchor region and adjacent to the fixed electrode, and wherein the at least one fixed electrode and the at least one anchor region each include a plurality of gaps, and wherein the plurality of gaps in the at least one fixed electrode and at least one anchor region is disposed in the chamber and exposed to the fluid.

8. A microelectromechanical device comprising:
a substrate;
a mechanical structure disposed over the substrate wherein the mechanical structure includes moveable and fixed electrodes;
a periphery area disposed over the substrate;
a getter area comprising a plurality of gaps, wherein the plurality of gaps is disposed in predetermined portions of the periphery area and the fixed electrode;
a chamber, wherein at least a portion of the mechanical structure and the getter area are disposed in the chamber, and wherein the getter area is exposed to fluid in the chamber; and
a thin film encapsulation structure, disposed over the mechanical structure, the periphery area and the getter area, wherein the thin film encapsulation structure seals the chamber, and wherein the fluid is contained in the chamber after the chamber is sealed.

9. The device of claim 8 wherein the getter area includes gaps in portions of the periphery area and the fixed electrode.

10. The device of claim 8 wherein the getter area is capable of capturing impurities, atoms or molecules that are out-gassed from materials contained within the chamber.

11. The device of claim 8 wherein the mechanical structure is a resonator.

12. The device of claim 11 wherein the thin film encapsulation structure includes first and second encapsulation layers.

13. The device of claim 12 wherein the first encapsulation layer includes polycrystalline silicon, porous polycrystalline silicon, amorphous silicon, silicon carbide, silicon nitride, silicon/germanium, germanium, or gallium arsenide.

14. The device of claim 12 wherein the second encapsulation layer includes polycrystalline silicon, porous polycrystalline silicon, amorphous silicon, germanium, silicon/germanium, gallium arsenide, or silicon carbide.

15. A microelectromechanical device comprising:
a substrate;
a mechanical structure disposed over the substrate, wherein at least a portion of the mechanical structure is disposed in a chamber;
a fluid disposed in the chamber;
a periphery area disposed over the substrate, wherein the periphery area includes a plurality of gaps, wherein the plurality of gaps is disposed in the chamber and exposed to the fluid therein;
a thin film encapsulation structure, disposed over the mechanical structure and the periphery area, to partially define and seal the chamber, wherein the fluid is contained in the chamber after the chamber is sealed, and wherein the thin film encapsulation structure includes:
a first encapsulation layer comprising polycrystalline silicon, porous polycrystalline silicon, amorphous silicon, silicon carbide, silicon nitride, silicon/germanium, germanium, or gallium arsenide; and
a second encapsulation layer, disposed on or over the first encapsulation layer, the second encapsulation layer comprising polycrystalline silicon, porous polycrystalline silicon, amorphous silicon, germanium, silicon/germanium, gallium arsenide, or silicon carbide.

16. The device of claim 15 wherein the mechanical structure includes at least one fixed electrode, wherein the at least one fixed electrode includes a plurality of gaps therein, and wherein the plurality of gaps in at least one fixed electrode is disposed in the chamber and exposed to the fluid.

17. The device of claim 15 wherein the mechanical structure includes at least one anchor region, wherein the at least one anchor region includes a plurality of gaps therein, and wherein the plurality of gaps in at least one anchor region is disposed in the chamber and exposed to the fluid.

18. The device of claim 15 wherein the mechanical structure is a resonator including at least one fixed electrode, at least one anchor region, and at least one moveable electrode that is physically connected to the at least one anchor region and adjacent to the at least one fixed electrode, and wherein the at least one fixed electrode and the at least one anchor region each include a plurality of gaps, wherein the plurality of gaps in the at least one fixed electrode and at least one anchor region is disposed in the chamber and exposed to the fluid.

19. The device of claim 15 wherein the microelectromechanical device further includes a getter area, disposed in predetermined portions of the periphery area and at least one fixed electrode.

20. The device of claim 19 wherein the getter area includes gaps in portions of the periphery area and the at least one fixed electrode.

21. The device of claim 19 wherein the getter area is capable of capturing impurities, atoms or molecules that are out-gassed from materials contained within the chamber.

22. The device of claim 21 wherein the mechanical structure is a resonator.

23. The device of claim 2 wherein the first encapsulation layer includes monocrystalline silicon, polycrystalline silicon, porous polycrystalline silicon, amorphous silicon, silicon carbide, silicon nitride, silicon/germanium, germanium, or gallium arsenide.

24. The device of claim 23 wherein the second encapsulation layer is a semiconductor material including monocrystalline silicon, polycrystalline silicon, porous polycrystalline silicon, amorphous silicon, silicon/germanium, germanium, and/or gallium arsenide.

25. The device of claim 12 wherein the first encapsulation layer includes monocrystalline silicon, polycrystalline silicon, porous polycrystalline silicon, amorphous silicon, silicon carbide, silicon nitride, silicon/germanium, germanium, or gallium arsenide.

26. The device of claim 25 wherein the second encapsulation layer is a semiconductor material including monocrystalline silicon, polycrystalline silicon, porous polycrystalline silicon, amorphous silicon, silicon/germanium, germanium, and/or gallium arsenide.

27. The device of claim 15 wherein the first encapsulation layer is monocrystalline silicon, polycrystalline silicon, porous polycrystalline silicon, amorphous silicon, silicon/germanium, germanium, and/or gallium arsenide.

28. The device of claim 27 wherein the second encapsulation layer is disposed on the first encapsulation layer and is a semiconductor material including monocrystalline silicon, polycrystalline silicon, porous polycrystalline silicon, amorphous silicon, silicon/germanium, germanium, and/or gallium arsenide.

* * * * *

(12) EX PARTE REEXAMINATION CERTIFICATE (6921st)
United States Patent
Lutz et al.

(10) Number: US 7,115,436 C1
(45) Certificate Issued: Jul. 7, 2009

(54) INTEGRATED GETTER AREA FOR WAFER LEVEL ENCAPSULATED MICROELECTROMECHANICAL SYSTEMS

(75) Inventors: Markus Lutz, Palo Alto, CA (US); Aaron Partridge, Palo Alto, CA (US)

(73) Assignee: Robert Bosch GmbH, Stuttgart (DE)

Reexamination Request:
No. 90/008,508, Apr. 2, 2007

Reexamination Certificate for:
Patent No.: 7,115,436
Issued: Oct. 3, 2006
Appl. No.: 10/777,326
Filed: Feb. 12, 2004

(51) Int. Cl.
*H01L 21/00* (2006.01)

(52) U.S. Cl. .......................................................... 438/48
(58) Field of Classification Search .................. None
See application file for complete search history.

(56) References Cited

U.S. PATENT DOCUMENTS

| | | | |
|---|---|---|---|
| 5,025,346 A | 6/1991 | Tang et al. | 361/283.1 |
| 5,493,177 A | 2/1996 | Muller et al. | 313/578 |
| 6,028,332 A | 2/2000 | Kano et al. | 257/254 |
| 6,200,882 B1 | 3/2001 | Drake et al. | 438/464 |
| 6,538,312 B1 | 3/2003 | Peterson et al. | 257/680 |
| 7,041,225 B2 | 5/2006 | Lutz | 216/2 |

FOREIGN PATENT DOCUMENTS

WO   WO 03/105198   12/2003

*Primary Examiner*—Pia Tibbits

(57) ABSTRACT

There are many inventions described and illustrated herein. In one aspect, present invention is directed to a thin film encapsulated MEMS, and technique of fabricating or manufacturing a thin film encapsulated MEMS including an integrated getter area and/or an increased chamber volume, which causes little to no increase in overall dimension(s) from the perspective of the mechanical structure and chamber. The integrated getter area is disposed within the chamber and is capable of (i) "capturing" impurities, atoms and/or molecules that are out-gassed from surrounding materials and/or (ii) reducing and/or minimizing the adverse impact of such impurities, atoms and/or molecules (for example, reducing the probability of adding mass to a resonator which would thereby change the resonator's frequency). In this way, the thin film wafer level packaged MEMS of the present invention includes a relatively stable, controlled pressure environment within the chamber to provide, for example, a more stable predetermined, desired and/or selected mechanical damping of the mechanical structure.

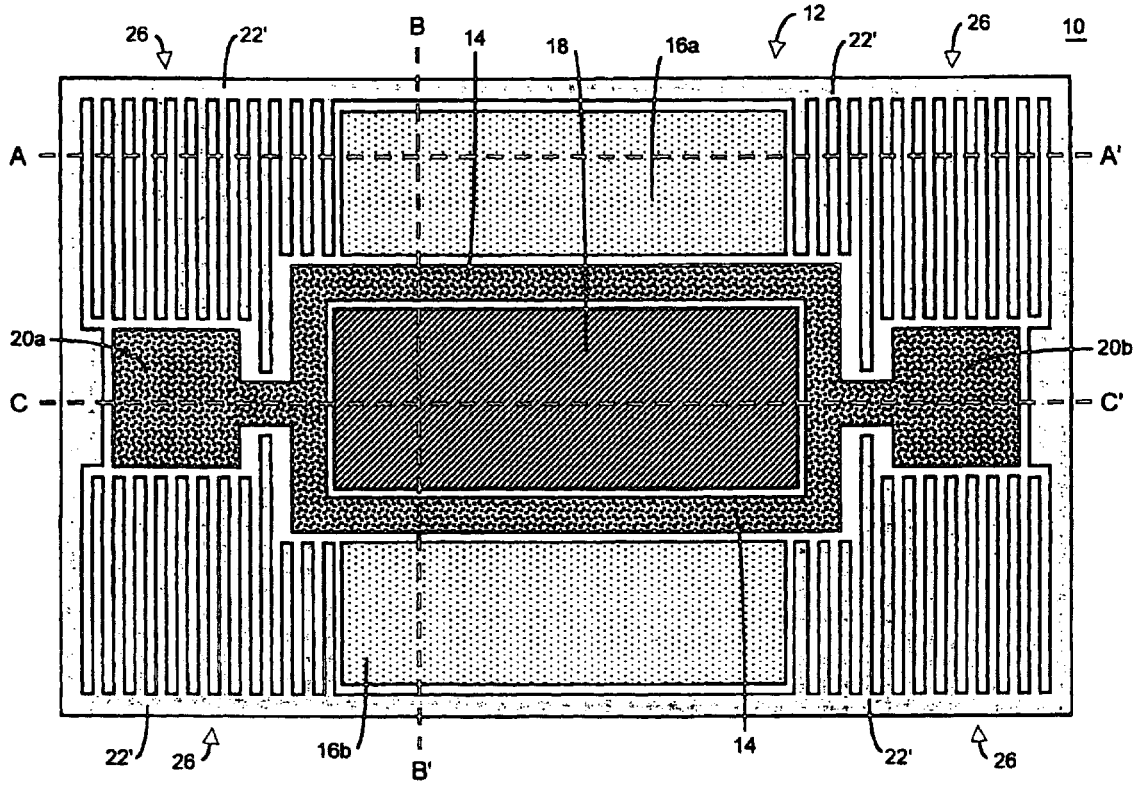

US 7,115,436 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 8 and 15 are determined to be patentable as amended.

Claims 2–7, 9–14 and 16–28, dependent on an amended claim, are determined to be patentable.

New claims 29–72 are added and determined to be patentable.

1. A microelectromechanical device comprising:
a substrate;
a mechanical structure disposed over the substrate, wherein at least a portion of the mechanical structure is disposed in a chamber;
a fluid disposed in the chamber;
a periphery area disposed over the substrate, wherein the periphery area includes a plurality of gaps therein, wherein the plurality of gaps is disposed in the chamber and exposed to the fluid; and
a thin film encapsulation structure, disposed over the mechanical structure and the periphery area, to partially define and seal the chamber,
wherein the fluid is contained in the chamber after the chamber is sealed, *and*
*wherein the mechanical structure and the periphery area are formed within a single layer that extends over the substrate.*

8. A microelectromechanical device comprising:
a substrate;
a mechanical structure disposed over the substrate wherein the mechanical structure includes moveable and fixed electrodes;
a periphery area disposed over the substrate;
a getter area comprising a plurality of gaps, wherein the plurality of gaps is disposed in predetermined portions of the periphery area and the fixed [electrode] *electrodes, and wherein a first portion of the periphery area at a first side of the mechanical structure includes a portion of the getter area formed by a plurality of components with gaps extending therebetween*;
a chamber, wherein at least a portion of the mechanical structure and the getter area are disposed in the chamber, and wherein the getter area is exposed to fluid in the chamber; and
a thin film encapsulation structure, disposed over the mechanical structure, the periphery area and the getter area, wherein the thin film encapsulation structure seals the chamber, and wherein the fluid is contained in the chamber after the chamber is sealed.

15. A microelectromechanical device comprising:
a substrate;
a mechanical structure disposed over the substrate, wherein at least a portion of the mechanical structure is disposed in a chamber;
a fluid disposed in the chamber;
a periphery area disposed over the substrate, wherein the periphery area includes a plurality of gaps, wherein the plurality of gaps is disposed in the chamber and exposed to the fluid therein; *and*
a thin film encapsulation structure, disposed over the mechanical structure and the periphery area, to partially define and seal the chamber, wherein the fluid is contained in the chamber after the chamber is sealed, and wherein the thin film encapsulation structure includes:
a first encapsulation layer comprising polycrystalline silicon, porous polycrystalline silicon, amorphous silicon, silicon carbide, silicon nitride, silicon/germanium, germanium, or gallium arsenide; and
a second encapsulation layer, disposed on or over the first encapsulation layer, the second encapsulation layer comprising polycrystalline silicon, porous polycrystalline silicon, amorphous silicon, germanium, silicon/germanium, gallium arsenide, or silicon carbide;
*wherein the mechanical structure and the periphery area are formed within a single layer that extends over the substrate.*

*29. The device of claim 1, wherein the mechanical structure includes an electrode exposed to the fluid.*

*30. The device of claim 1, wherein the mechanical structure includes an electrode, which, with respect to at least one path, is separated from each of the plurality of gaps by only the fluid.*

*31. The device of claim 1, wherein any point in the chamber, with respect to at least one path, is separated from any other point in the chamber by only the fluid.*

*32. The device of claim 1, wherein at least a portion of the periphery area is disposed directly over and in contact with the substrate.*

*33. The device of claim 1, wherein the plurality of gaps is proximal to or adjacent to the mechanical structure.*

*34. The device of claim 1, wherein the plurality of gaps increases a volume of the chamber by at least 10 times.*

*35. The device of claim 1, wherein the plurality of gaps and the mechanical structure are etched in a same etching process.*

*36. The device of claim 1, wherein the plurality of gaps is formed by removing a portion of the periphery area.*

*37. The device of claim 1, wherein the plurality of gaps forms repeating patterns.*

*38. The device of claim 1, wherein the plurality of gaps extends to a sacrificial layer.*

*39. The device of claim 1, wherein a first portion of the periphery area at a first side of the mechanical structure includes a plurality of components formed with gaps extending therebetween.*

*40. The device of claim 39, wherein the plurality of components is formed in the single layer.*

*41. The device of claim 1, wherein the substrate has a first surface, the first surface having a largest area among surfaces of the substrate, and the mechanical structure and the periphery area are disposed over the first surface of the substrate.*

*42. The device of claim 41, wherein the plurality of gaps extend between components.*

*43. The device of claim 1, wherein the substrate has a first surface, the first surface having a largest area among sur-* faces of the substrate, and the plurality of gaps extend between component planes that extend substantially perpendicular to the first surface of the substrate.

44. The device of claim 8, wherein the mechanical structure includes an electrode exposed to the fluid.

45. The device of claim 8, wherein the mechanical structure includes an electrode, which, with respect to at least one path, is separated from each of the plurality of gaps by only the fluid.

46. The device of claim 8, wherein any point in the chamber, with respect to at least one path, is separated from any other point in the chamber by only the fluid.

47. The device of claim 8, wherein at least a portion of the periphery area is disposed directly over and in contact with the substrate.

48. The device of claim 8, wherein the plurality of gaps is proximal to or adjacent to the mechanical structure.

49. The device of claim 8, wherein the plurality of gaps increases a volume of the chamber by at least 10 times.

50. The device of claim 8, wherein the plurality of gaps and the mechanical structure are etched in a same etching process.

51. The device of claim 8, wherein the plurality of gaps is formed by removing a portion of the periphery area.

52. The device of claim 8, wherein the plurality of gaps forms repeating patterns.

53. The device of claim 8, wherein the plurality of gaps extends to a sacrificial layer.

54. The device of claim 8, wherein the mechanical structure and the periphery area are formed within a single layer that extends over the substrate.

55. The device of claim 54, wherein the plurality of components are formed in the single layer.

56. The device of claim 8, wherein the substrate has a first surface, the first surface having a largest area among surfaces of the substrate and the mechanical structure and the getter area are disposed over the first surface of the substrate.

57. The device of claim 8, wherein the substrate has a first surface, the first surface having a largest area among surfaces of the substrate and the plurality of gaps extend between component planes that extend substantially perpendicular to the first surface of the substrate.

58. The device of claim 15, wherein the mechanical structure includes an electrode exposed to the fluid.

59. The device of claim 15, wherein the mechanical structure includes an electrode, which, with respect to at least one path, is separated from each of the plurality of gaps by only the fluid.

60. The device of claim 15, wherein any point in the chamber, with respect to at least one path, is separated from any other point in the chamber by only the fluid.

61. The device of claim 15, wherein at least a portion of the periphery area is disposed directly over and in contact with the substrate.

62. The device of claim 15, wherein the plurality of gaps is proximal to or adjacent to the mechanical structure.

63. The device of claim 15, wherein the plurality of gaps increases a volume of the chamber by at least 10 times.

64. The device of claim 15, wherein the plurality of gaps and the mechanical structure are etched in a same etching process.

65. The device of claim 15, wherein the plurality of gaps is formed by removing a portion of the periphery area.

66. The device of claim 15, wherein the plurality of gaps forms repeating patterns.

67. The device of claim 15, wherein the plurality of gaps extends to a sacrificial layer.

68. The device of claim 15, wherein a first portion of the periphery area at a first side of the mechanical structure includes a plurality of components formed with gaps extending therebetween.

69. The device of claim 68, wherein the plurality of components is formed in the single layer.

70. The device of claim 15, wherein the substrate has a first surface, the first surface having a largest area among surfaces of the substrate, and the mechanical structure and the periphery area are disposed over the first surface of the substrate.

71. The device of claim 70, wherein the plurality of gaps extend between components.

72. The device of claim 15, wherein the substrate has a first surface, the first surface having a largest area among surfaces of the substrate, and the plurality of gaps extend between component planes that extend substantially perpendicular to the first surface of the substrate.

\* \* \* \* \*